United States Patent
Masato

[19]

[11] Patent Number: 6,054,902
[45] Date of Patent: *Apr. 25, 2000

[54] HIGH-FREQUENCY AMPLIFIER

[75] Inventor: Yoshihito Masato, Machida, Japan

[73] Assignee: Murata Maufacturing Co., Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/909,211

[22] Filed: Aug. 11, 1997

[30] Foreign Application Priority Data

Aug. 9, 1996 [JP] Japan ................................. 8-227769

[51] Int. Cl.$^7$ ................................................ H03F 3/191
[52] U.S. Cl. ......................... 330/306; 330/147; 330/148
[58] Field of Search ................................... 330/306, 302, 330/286, 147, 148, 303

[56] References Cited

U.S. PATENT DOCUMENTS

| | | | |
|---|---|---|---|
| 4,107,621 | 8/1978 | Furutani et al. | 330/306 |
| 4,803,443 | 2/1989 | Takagi et al. | 330/286 |
| 5,420,541 | 5/1995 | Upton et al. | 330/286 |

FOREIGN PATENT DOCUMENTS

| | | | |
|---|---|---|---|
| 404047701 | 2/1992 | Japan | 330/302 |

*Primary Examiner*—Benny Lee
*Assistant Examiner*—Khanh Van Nguyen
*Attorney, Agent, or Firm*—Ostrelenk, Faber, Gerb & Soffen, LLP

[57] ABSTRACT

A high-frequency amplifier that can reduce the size, weight and price of a device that contains this high-frequency amplifier. The high-frequency amplifier has, for example, an input matching circuit of the low-pass type and an input matching circuit of the high-pass type, connected in parallel and provided at the input side or terminal of a power amplification circuit. Matching is thereby performed corresponding to either one of two kinds of transmission input signals, whose frequencies are different from each other, by the input matching circuit of the low-pass type, and by the input matching circuit of the high-pass type, respectively. Moreover, for example, an output matching circuit of the low-pass type and an output matching circuit of the high-pass type are connected in parallel and provided at the output side or terminal of the power amplification circuit. Matching is performed corresponding to either one of two transmission output signal frequencies by the output matching circuit of the low-pass type, and the output matching circuit of the high-pass type, respectively.

21 Claims, 11 Drawing Sheets

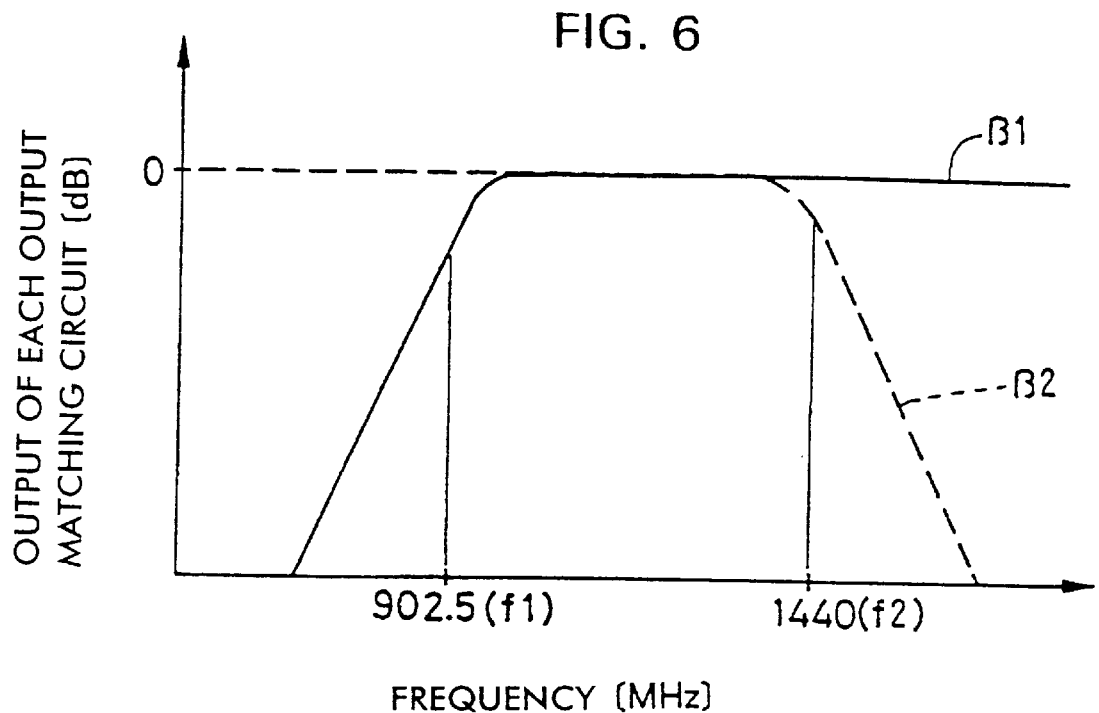
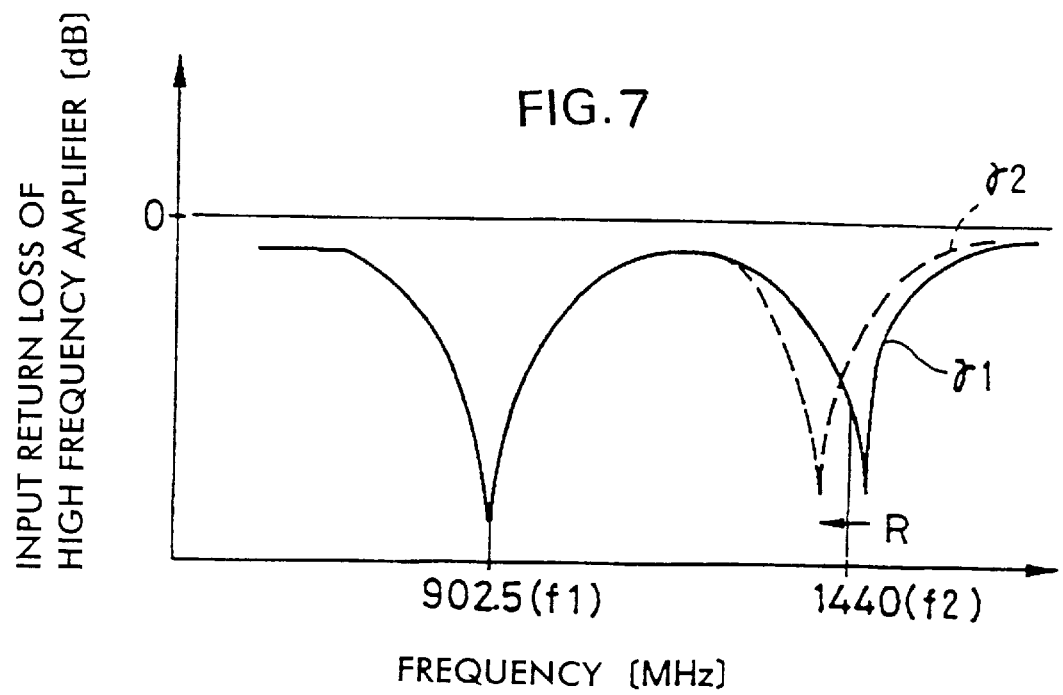

HIGH-FREQUENCY AMPLIFIER

BACKGROUND OF THE INVENTION

1. Field of the Invention

The present invention generally relates to a high-frequency amplifier suitable for use in radio communication equipment such as portable telephones and cordless telephones and, more particularly, to a high-frequency amplifier which performs matching corresponding to each of a plurality of high-frequency signals of different frequencies and that these high-frequency signals are amplified by a single amplification circuit.

2. Description of the Related Art

Hitherto, in mobile (radio) communication equipment such as portable telephones and cordless telephones, radio waves of a corresponding dedicated frequency band (namely, an exclusive or private frequency band) have been used. Therefore, only a high-frequency amplifier for amplifying high-frequency radio signals in the exclusive frequency band is needed to be provided in a transmitting device (or transmitter) incorporated in a portable telephone or the like.

Hereinafter, a conventional high-frequency amplifier will be described with reference to FIG. 10.

In FIG. 10, reference numeral 1 designates the conventional high-frequency amplifier. This high-frequency amplifier 1 is provided in a transmitter incorporated in, for example, a portable telephone set and is a power amplifier dedicated to amplifying high-frequency signals in a dedicated frequency band, which are transmitted as radio waves from this portable telephone. For instance, the frequencies of the dedicated frequency band range from 890 MHz to 915 MHz, the center frequency thereof using 902.5 MHz, and the high-frequency amplifier 1 may be suitable for amplifying only high-frequency signals of such a frequency band.

Reference numeral 2 denotes an input terminal of the high-frequency amplifier 1. This input terminal 2 is connected to a transmission signal generating circuit (not shown) incorporated in the portable telephone, which synthesizes a signal from a speech signal and a carrier signal and outputs transmission input signals (namely, high-frequency input signals), to this input terminal 2.

Reference numeral 3 designates an input matching circuit connected to the input terminal 2 through a coupling capacitor 4. This input matching circuit 3 is configured by connecting a coil 5, which serves as an inductive device or element, to a capacitor 6, which serves as a capacitive device or element, in an L-shaped configuration, as illustrated in FIG. 10. Parameters such as the inductance of the coil 5 and the capacitance of the capacitor 6 are set in such a manner that matching is achieved corresponding to the center frequency (namely, 902.5 MHz) of the transmission input signal. Namely, a reflection coefficient corresponding to the center frequency of the transmission input signal is optimized. Moreover, the parameters of the coil 5 and the capacitor 6 are set in such a way that the input return loss of the high-frequency amplifier 1 is minimized.

Reference numeral 7 designates a power amplification circuit connected to the output terminal of the input matching circuit 3. This power amplification circuit 7 comprises a field effect transistor (hereunder referred to as "FET") 8, which is operative to perform power amplification, and a bias circuit (not shown). Further, the power amplification circuit 7 amplifies the transmission input signal enough so that the input signal can be transmitted by the portable telephone, for example, to 1 W or so. The amplified transmission output signals are outputted to an output matching circuit 9 (to be described later).

Reference numeral 9 denotes the output matching circuit provided at an output side of the power amplification circuit 7. This output matching circuit 9 is constituted by connecting a coil 10 to a capacitor 11 in an L-shaped configuration, almost the same as the input matching circuit 3. Parameters such as the inductance of the coil 10 and the capacitance of the capacitor 11 are set in such a manner that matching is achieved corresponding to the center frequency (namely, 902.5 MHz) of the transmission output signal. Namely, by taking the output characteristics, the bias conditions and gain of the power amplification circuit 7 into consideration, each of the parameters of the coil 10 and the capacitor 11 is set in such a way that the reflection coefficient corresponds to the center frequency of the aforementioned transmission output signal.

Reference numeral 12 designates a coupling capacitor for eliminating a bias current. Reference numeral 13 denotes an output terminal of the high-frequency amplifier 1. This output terminal 13 is connected to an antenna attached to the portable telephone.

In the conventional high-frequency amplifier 1 configured in this manner, the input matching circuit 3 is set in such way that the matching corresponds to the transmission input signal, whose center frequency is 902.5 MHz.

However, in some cases, the transmission frequency band of a portable telephone must vary with the area, in which the portable telephone is used. For example, the frequency band may range from 890 MHz to 915 MHz in a certain area, and may range from 1430 MHz to 1450 MHz in another area. Thus, a portable telephone of the common type, by which calls can be made in a plurality of areas, must be able to transmit in at least two different frequency bands.

Thus, as shown in FIG. 11, another portable telephone of the common type has a parallel connection of a first high-frequency amplifier 21, by which matching is accomplished corresponding to the frequency band of a certain area, and a second high-frequency amplifier 22, by which matching is accomplished corresponding to the frequency band used in another area. Changeover switches 23 are provided at the input side or terminal and the output side or terminal of each of the high-frequency amplifiers 21 and 22 so as to amplify transmission signals in two different frequency bands.

This amplifier, however, is required to have two power amplification circuits 21 and 22, of the same configuration, in parallel, as well as the changeover switches 23. Consequently, the size of a circuit board, on which these circuits and switches are mounted, increases. Moreover, it is difficult to reduce the size and weight of the amplifier. Additionally, the number of parts or components increases. This results in an increase in the cost of the amplifier.

SUMMARY OF THE INVENTION

The present invention avoids the aforementioned problems of the conventional high-frequency amplifier.

The present invention provides a high-frequency amplifier which can amplify high-frequency signals having two different frequencies, to thereby reduce the size, weight and price of a device in which this high-frequency amplifier is provided.

To achieve the foregoing object, in accordance with a first aspect of the present invention, there is provided a high-frequency amplifier that comprises: an input matching circuit for performing a matching corresponding to a first high-frequency input signal and to a second high-frequency input signal having different frequencies; an amplification circuit, which is connected to an output side or terminal of the input matching circuit, for outputting a first high-frequency output signal by amplifying the first high-frequency input signal, and alternatively, for outputting a second high-frequency output signal by amplifying the second high-frequency input signal; a first output matching circuit, which is connected to an output side or terminal of the aforesaid amplification circuit, for performing a matching corresponding to the first high-frequency output signal; and a second output matching circuit, which is connected to the output side or terminal of the amplification circuit in parallel with the first output matching circuit, for performing a matching corresponding to the second high-frequency output signal.

Thus, by connecting the first and second output matching circuits in parallel with each other as above described, matching corresponding to each of the first and second high-frequency output signals can be effected. This is done by setting optimum reflection coefficients, which respectively correspond to the first and second high-frequency output signals, by taking the output characteristics, bias conditions and gain of the amplification circuit into consideration.

Thus, the first output matching circuit sets an optimum reflection coefficient corresponding to the first high-frequency output signal, while the second output matching circuit sets an optimum reflection coefficient corresponding to the second high-frequency output signal. By connecting the output matching circuits in parallel with each other, matching corresponding to each of the high-frequency signals is achieved by a single high-frequency amplifier.

On the other hand, matching corresponding to both the first and second high-frequency input signals is effected by the input matching circuit. Namely, matching corresponding to each of the first and second high-frequency input signals is accomplished in such a way that the input return loss of this high-frequency amplifier decreases.

Note that the input matching circuit according to the above-described first aspect of the present invention may be constituted by either a single circuit or by a combination of a plurality of input matching devices. Thus, in accordance with a second aspect of the present invention, there is provided a high-frequency amplifier that comprises: a first input matching circuit for performing matching corresponding to a first high-frequency input signal; and a second input matching circuit, which is connected in parallel with the first input matching circuit, for performing matching corresponding to a second high-frequency input signal, whose frequency is different from that of the first high-frequency input signal.

Thus, by connecting the first and second input matching circuits in parallel with each other as described hereinabove, matching corresponding to each of the first and second high-frequency input signals can be accurately or suitably effected.

Since the first and second high-frequency input signals are different in frequency from each other, to achieve matching corresponding to each of the high-frequency input signals in such a manner as to minimize the input return loss, it is preferable for a reflection coefficient corresponding to the first high-frequency input signal and another reflection coefficient corresponding to the second high-frequency input signal to be set at optimum values, by the first and second input matching circuits, respectively.

By connecting the input matching circuits in parallel with each other, matching is accurately or appropriately achieved corresponding to each of the two high-frequency input signals, whose frequencies are different from each other, as in the case of the first aspect of the present invention.

According to a third aspect of the invention, the first input matching circuit comprises a low-pass filter that performs matching corresponding to the first high-frequency input signal and cuts off the second high-frequency input signal, whose frequency is higher than that of the first high-frequency input signal. Moreover, the second input matching circuit is a high-pass filter that performs matching corresponding to the second high-frequency input signal and cuts off the first high-frequency input signal.

In such a configuration, a matching circuit of the low-pass filter type is employed as the first input (matching) circuit. Thus, the first input matching circuit has frequency characteristics similar to those of a low-pass filter, namely, the property of cutting off the second high-frequency input signal, whose frequency is higher than that of the first high-frequency input signal. Therefore, even if the parameters corresponding to the circuit elements composing the first input matching circuit (for instance, the inductance of the coil and the capacitance of the capacitor) are changed so as to perform matching corresponding to the first high-frequency input signal, and if the reflection coefficient corresponding to the first high-frequency input signal is thus adjusted, the reflection coefficient corresponding to the second high-frequency input signal, which is set by the second input matching circuit, hardly changes.

Further, a matching circuit of the high-pass filter type is employed as the second input (matching) circuit. Thus, the second input matching circuit has frequency characteristics similar to those of a high-pass filter, namely, the property of cutting off the first high-frequency input signal, whose frequency is lower than that of the second high-frequency input signal. Therefore, even if the parameters corresponding to the circuit elements composing the second input matching circuit (for instance, the inductance of the coil and the capacitance of the capacitor) are changed so as to perform matching corresponding to the second high-frequency input signal, and if the reflection coefficient corresponding to the second high-frequency input signal is thus adjusted, the reflection coefficient corresponding to the first high-frequency input signal, which is set by the first input matching circuit, scarcely changes.

Thus, the first and second input matching circuits are independent from each other. Hence, the setting of the reflection coefficients by the first input matching circuit and by the second input matching circuit are achieved independently of each other. Consequently, matching is easily accomplished corresponding to two high-frequency input signals with different frequencies.

In accordance with a fourth aspect of the present invention, there is provided still another high-frequency amplifier that comprises: a first input matching circuit for performing matching corresponding to a first high-frequency input signal; and a second input matching circuit, which is connected in series to an output side or terminal of the first input matching circuit, for performing matching corresponding to a second high-frequency input signal, whose frequency is different from that of the first high-frequency input signal.

By connecting the first and second input matching circuits in series with each other, matching corresponding to each of the first and second high-frequency input signals can be accurately or suitably effected.

Since the first and second high-frequency input signals are different in frequency from each other, to achieve matching corresponding to each of the high-frequency input signals in such a manner as to minimize the input return loss, it is important to set a reflection coefficient corresponding to the first high-frequency input signal and to set another reflection coefficient corresponding to the second high-frequency input signal at optimum values, respectively.

Thus, the first input matching circuit sets the reflection coefficient, which corresponds to the first high-frequency input signal, at an optimum value, while the second input matching circuits sets the reflection coefficient, which corresponds to the second high-frequency input signal, at an optimum value. Further, by connecting the input matching circuits in series with each other, matching is accurately or appropriately achieved corresponding to both of the two high-frequency input signals, whose frequencies are different from each other.

On the other hand, by connecting the first and second output matching circuits in parallel with each other, matching can be effected corresponding to both of the first and second high-frequency output signals, as in the case of the first aspect of the present invention.

In a fifth aspect of the present invention, the first input matching circuit according to the fourth aspect of the invention is a matching circuit of the high-pass filter type that performs matching corresponding to the first high-frequency input signal and permits the second high-frequency input signal, whose frequency is higher than that of the first high-frequency input signal, to pass therethrough. Moreover, the second input matching circuit is a matching circuit of the low-pass filter type that performs matching corresponding to the second high-frequency input signal and permits the first high-frequency input signal to pass therethrough.

As with the previous aspects of the invention, the first and second input matching circuits are independent of each other. Therefore, the setting of the reflection coefficient by the first input matching circuit and the setting of the reflection coefficient by the second input matching circuit are achieved independently of each other. Consequently, matching is more easily accomplished corresponding to each of the two kinds of the high-frequency input signals, whose frequencies are different from each other.

Furthermore, in the case of a sixth aspect of the invention, which is a modification of the fourth aspect of the present invention, the first input matching circuit is a matching circuit of the low-pass filter type that performs matching corresponding to the first high-frequency input signal and permits the second high-frequency input signal, whose frequency is lower than that of the first high-frequency input signal, to pass therethrough. Further, the second input matching circuit is a matching circuit of the high-pass filter type that performs matching corresponding to the second high-frequency input signal and permits the first high-frequency input signal to pass therethrough. Advantages or effects similar to those of the fifth aspect of the present invention are obtained.

In the case of a seventh aspect of the invention, which is a feature of any one of the first, second, third, fourth, fifth or sixth aspects of the present invention, the first output matching circuit is a matching circuit of the low-pass filter type that performs matching corresponding to the first high-frequency output signal and cuts off the second high-frequency output signal, whose frequency is higher than that of the first high-frequency output signal. Moreover, the second output matching circuit is a matching circuit of the high-pass filter type that performs matching corresponding to the second high-frequency output signal and cuts off the first high-frequency output signal.

In the case of such a configuration, a matching circuit of the low-pass filter type is employed as the first output (matching) circuit. Thus, the first output matching circuit has frequency characteristics similar to those of a low-pass filter, namely, the property of cutting off the second high-frequency output signal, whose frequency is higher than that of the first high-frequency output signal. Therefore, even if the parameters corresponding to the circuit elements composing the first input matching circuit (for instance, the inductance of the coil and the capacitance of the capacitor) are changed so as to perform matching corresponding to the first high-frequency output signal, and if the reflection coefficient corresponding to the first high-frequency output signal is thus regulated, the reflection coefficient corresponding to the second high-frequency output signal, which is set by the second output matching circuit, hardly changes.

Further, a matching circuit of the high-pass filter type is employed as the second output (matching) circuit. Thus, the second input matching circuit has frequency characteristics similar to those of a high-pass filter, namely, the property of cutting off the first high-frequency output signal, whose frequency is lower than that of the second high-frequency output signal. Therefore, even if the parameters corresponding to the circuit elements composing the second output matching circuit (for instance, the inductance of the coil and the capacitance of the capacitor) are changed so as to perform matching corresponding to the second high-frequency output signal, and if the reflection coefficient corresponding to the second high-frequency output signal is thus regulated, the reflection coefficient corresponding to the first high-frequency output signal, which is set by the first output matching circuit, scarcely changes.

Thus, the first and second output matching circuits are independent of each other. Hence, the setting of the reflection coefficient by the first output matching circuit and the setting of the reflection coefficient by the second output matching circuit are achieved independently of each other. Consequently, matching is easily accomplished corresponding to each of the two kinds of high-frequency output signals, whose frequencies are different from each other.

According to the first aspect of the invention, since the first and second output matching circuits are connected to the output side or terminal of the amplifying circuit in parallel with each other, the amplification factor corresponding to each of the high-frequency output signals can be maximized. Thereby, the two kinds of high-frequency output signals, whose frequencies are different from each other, can be amplified by a single high-frequency amplifier.

Therefore, the high-frequency amplifier of the present invention does not require changeover switches and two amplification circuits of similar configurations, which are required in the conventional amplifier. Consequently, the size, weight and price of a device, in which the high-frequency amplifier is provided, can be reduced.

In the case of the second aspect of the present invention, the first and second input matching circuits are connected in parallel with each other at the input side of the amplification circuit, while the first and second output matching circuits are connected in parallel with each other at the output side of the amplification circuit. Thus, matching can be performed corresponding to each of the two kinds of high-frequency input signals, whose frequencies are different from each other, at the input side of the amplification circuit. Thus, the input return loss corresponding to each of the high-frequency signals can be minimized. Moreover, the amplification factor corresponding to each of the high-frequency signals can be maximized.

In the case of the third aspect of the present invention, a matching circuit of the low-pass filter type is employed as the aforesaid first input matching circuit. Moreover, the matching circuit of the high-pass filter type, which performs a matching correspondingly to the second high-frequency input signal and cuts off the first high-frequency input signal, is employed as the aforesaid second input matching circuit. Thus, even if the parameters corresponding to the circuit elements composing the first input matching circuit are changed so as to perform matching corresponding to the first high-frequency input signal, this can have little effect on the matching corresponding to the first high-frequency input signal.

Thus, the design and regulation of the first input matching circuit can be performed independently of the second input matching circuit. Thereby, the design and regulation of each of the input matching circuits can be facilitated.

In the case of the fourth aspect of the present invention, the first and second input matching circuits are connected in series with each other at the input side of the amplification circuit, while the first and second output matching circuits are connected in parallel with each other at the output side of the amplification circuit. Thus, matching can be performed corresponding to each of the two kinds of high-frequency input signals, whose frequencies are different from each other, at the input side of the amplification circuit. Thus, the input return loss corresponding to each of the high-frequency signals can be minimized.

In the case of the fifth aspect of the present invention, matching circuits of the low-pass filter type are employed as both the aforesaid first and second input matching circuits. Thus, even if the parameters corresponding to the circuit elements composing the second input matching circuit are changed so as to perform matching corresponding to the second high-frequency input signal, this can have little effect on the matching corresponding to the second high-frequency input signal.

Thus, the design and regulation of the first input matching circuit can be performed independently of the second input matching circuit. Thereby, the design and regulation of each of the input matching circuits can be further facilitated.

Further, in the case where the first input matching circuit is a matching circuit of the low-pass filter type and where the aforesaid second input matching circuit is a matching circuit of the high-pass filter type, advantages or effects similar to those of the fifth aspect of the present invention are obtained.

In the case of the seventh high-frequency amplifier of the present invention, a matching circuit of the low-pass filter type is employed as the first output matching circuit, and a matching circuit of the high-pass filter type is employed as the aforesaid second output matching circuit. Thus, even if the parameters corresponding to the circuit elements composing the first output matching circuit are changed so as to perform matching corresponding to the first high-frequency output signal, this can have little effect on the matching corresponding to the second high-frequency output signal. Further, even if the parameters corresponding to the circuit elements composing the second output matching circuit are changed so as to perform matching corresponding to the second high-frequency output signal, this can have little effect on the matching corresponding to the first high-frequency output signal.

Thus, the design and regulation of the first output matching circuit can be performed independently of those of the second output matching circuit. Thereby, the design and regulation of each of the output matching circuit can be facilitated.

BRIEF DESCRIPTION OF THE DRAWINGS

Other features, objects and advantages of the present invention will become apparent from the following description of embodiments of the invention with reference to the drawings in which like reference characters designate like or corresponding parts throughout several views, and in which:

FIG. 6 is a characteristic diagram illustrating the frequency characteristics of an output matching circuit of the low-pass type and another output matching circuit of the high-pass type, which are provided in the fourth embodiment of the present invention;

FIG. 7 is a characteristic diagram illustrating the input return loss characteristics of the fourth embodiment of the present invention;

DETAILED DESCRIPTION OF EMBODIMENTS OF THE INVENTION

Hereinafter, embodiments of the present invention will be described in detail by referring to the accompanying drawings.

First, an example of application of a high-frequency amplifier embodying the present invention, namely, a first embodiment of the present invention to a high-frequency amplifier for amplifying a transmission signal of a portable telephone of the common type will be cited as an example, and will be described by referring to FIGS. 1 and 2.

Figure 1:
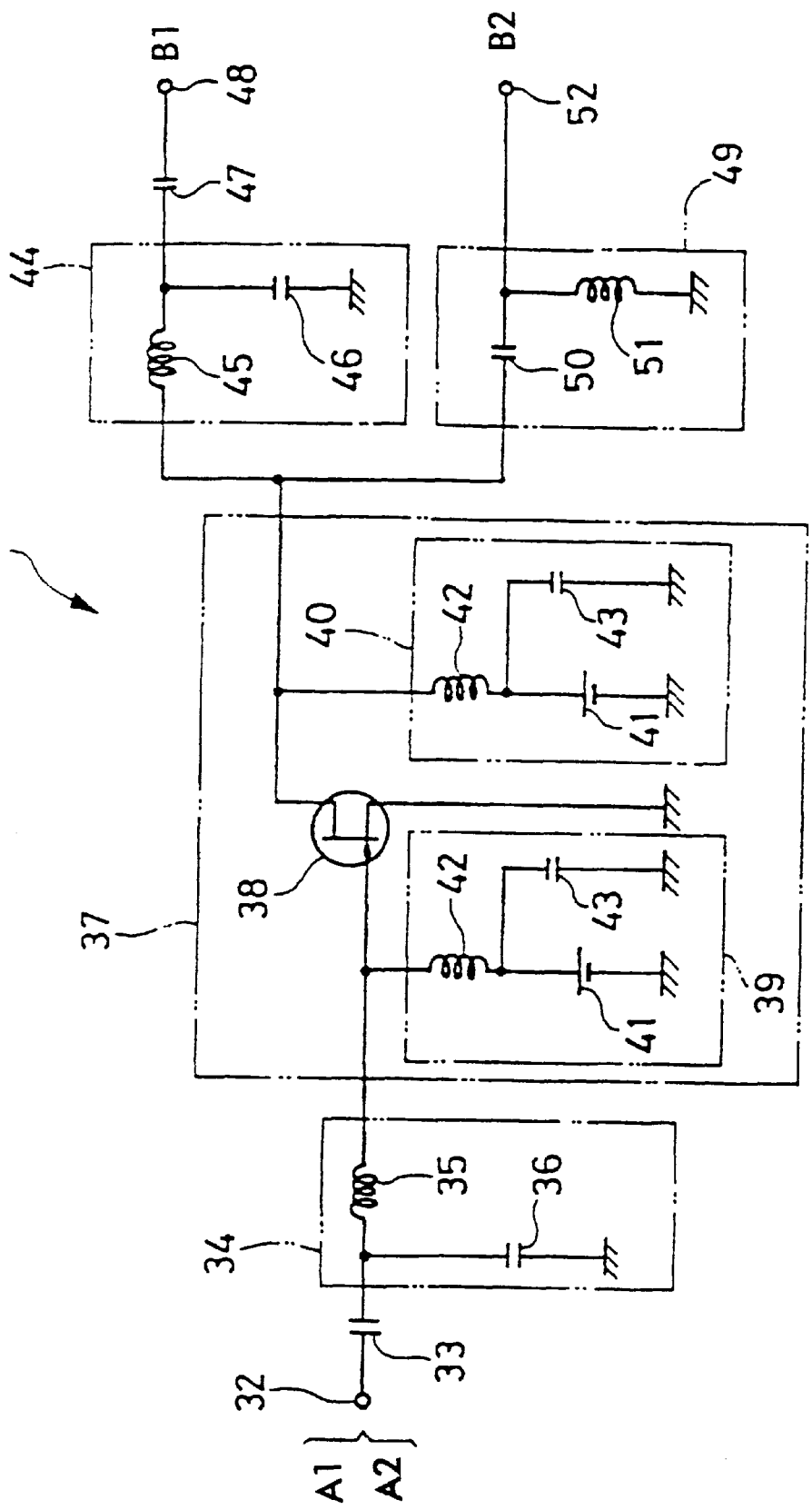
FIG. 1 is a circuit diagram illustrating the configuration of a first embodiment of the present invention.

In FIG. 1, reference numeral 31 designates a high-frequency amplifier of the present invention. This high-frequency amplifier 31 is, for example, a high-frequency power amplifier provided in a portable telephone adapted to send two kinds of transmission (radio) waves, the corresponding frequency bands of which are different from each other, and is utilized to amplify two kinds of transmission signals (namely, high-frequency signals) used as the transmission waves of different frequency bands. For instance, in the case that the frequencies of the frequency band of the transmission waves to be used in a certain area range from 890 MHz to 915 MHz and the center frequency f1 thereof is 902.5 MHz and that the frequencies of the frequency band of the transmission waves to be used in another area range from 1430 MHz to 1450 MHz and the center frequency f2 thereof is 1440 MHz, this high-frequency amplifier is adjusted in such a manner as to optimally amplify both of the transmission signal, whose center frequency is f1, and the transmission signal, whose center frequency is f2.

Reference numeral 32 designates an input terminal of a high-frequency amplifier 31. This input terminal 32 is connected to a transmission signal generating circuit (not shown) of the portable telephone of the common type. Transmission input signals, which are two kinds of high-frequency input signals of different frequency bands, are inputted from this transmission signal generating circuit to this input terminal 32. Namely, a transmission input signal A1, whose center frequency is f1 (namely, 902.5 MHz) and another transmission input signal A2, whose center frequency is f2 (namely, 1440 MHz), are inputted to this input terminal 32. Reference numeral 33 denotes a coupling capacitor for removing the d.c. components of the transmission input signals A1 and A2 at the input side of the high-frequency amplifier 31.

Reference numeral 34 denotes an input matching circuit of the low-pass filter type (hereunder referred to as the "input matching circuit 34 of the low-pass type"). This input matching circuit 34 of the low-pass type is composed of a coil 35, provided for example at a halfway point on a signal line extending from the input terminal 32 to the gate terminal of a field effect transistor FET 38 (to be described later), and a capacitor 36 provided between the signal line and the ground. Namely, the input matching circuit of the low-pass type 34 has a circuit configuration similar to that of what is called a low-pass filter (LPF), in which the coil 35 and the capacitor 36 are connected in an L-shaped configuration.

Further, in the input matching circuit 34 of the low-pass type, parameters such as the inductance of the coil 35 and the capacitance of the capacitor 36 are set in such a way that a matching is performed correspondingly to each of the transmission input signals A1 and A2. Namely, each of the parameters respectively corresponding to the coil 35 and the capacitor 36 is set so that a reflection coefficient corresponding to the center frequency f1 of the transmission input signal A1 and another reflection coefficient corresponding to the center frequency f2 of the transmission input signal A2 are optimized in such a way as to be brought into good balance and that the input return loss is minimized.

Reference numeral 37 designates a power amplification circuit connected to the output side or terminal of the input matching circuit 34 of the low-pass type. This power amplification circuit 37 is roughly composed of a field effect transistor 38 (hereunder referred to as an "FET 38"), an input-side bias circuit 39 for setting an input-side bias voltage of this FET 38, and an output-side bias circuit 40 for setting an output-side bias voltage of the FET 38. Moreover, each of the bias circuits 39 and 40 is constituted by connecting a d.c. power supply 41, a choke coil 42 and bypass capacitor 43 together, as illustrated in FIG. 1.

Further, this power amplification circuit 37 amplifies the transmission input signals A1 and A2, correspondingly to each of which a matching is accomplished by the input matching circuit 34 of the low-pass type, to the extent that these input signals can be used as transmission waves of the portable telephone (for example, to 1 W or so). Moreover, this power amplification circuit 37 outputs resultant signals to output matching circuits 44 and 49 as transmission output signals B1 and B2, respectively. Namely, this power amplification circuit 37 amplifies the transmission input signal A1 and outputs the transmission output signal B1, whose center frequency is f1. Furthermore, this power amplification circuit 37 amplifies the transmission input signal A2 and outputs the transmission output signal B2, whose center frequency is f2.

Incidentally, although the FET 38 is provided in this power amplification circuit 37 in this embodiment, another active element such as a bipolar transistor may be applied thereto instead of the FET 38. Further, although this power amplification circuit 37 is constituted by a single-stage amplifier including the single FET 38, the circuit 37 may be constituted by a multi-stage amplifier composed of a plurality of FETs or transistors.

Reference numeral 44 denotes an output matching circuit of the low-pass filter type (hereunder referred to as the "output matching circuit of the low-pass type 44") for performing a matching correspondingly to the transmission output signal B1. This output matching circuit 44 of the low-pass type comprises a coil 45, provided on a signal line extending from the drain terminal of the FET 38 to an output terminal 48 (to be described later), and a capacitor 46 provided between the signal line and the ground. Namely, the output matching circuit of the low-pass type 44 has a circuit configuration similar to that of what is called a low-pass filter (LPF), in which the coil 45 and the capacitor 46 are connected in an L-shaped configuration.

Further, in this output matching circuit 44 of the low-pass type, parameters such as the inductance of the coil 45 and the capacitance of the capacitor 46 are set in such a manner that a matching is performed correspondingly to the transmission output signal B1. Namely, each of the parameters respectively corresponding to the coil 45 and the capacitor 46 is set in such a way that a reflection coefficient corresponding to the center frequency f1 of the transmission output signal B1 is optimized.

Figure 2:
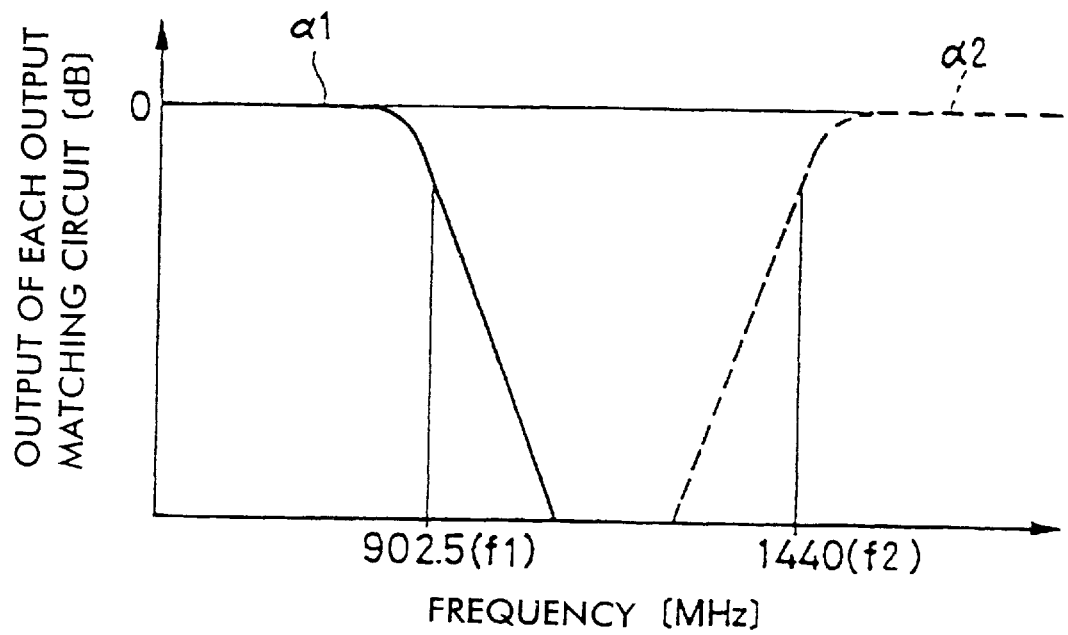
FIG. 2 is a characteristic diagram illustrating the frequency characteristics of an output matching circuit of the low-pass type and another output matching circuit of the high-pass type, which are provided in the first embodiment of the present invention.

Moreover, this output matching circuit 44 of the low-pass type has the frequency characteristic indicated by a characteristic line or curve α1 in FIG. 2. Namely, in the case that the parameters corresponding to the coil 45 and the capacitor 46 are set in such a manner that a matching is effected correspondingly to the center frequency f1 (namely, 902.5 MHz) of the transmission output signal B1, the output matching circuit 44 of the low-pass type has the characteristics, by which signals, whose frequencies are higher than the center frequency f1 of the transmission output signal B1, of the frequency band are cut off.

Here, note that as above described, the center frequency f1 of the transmission output signal B1 is, for example, 902.5 MHz, that the center frequency f2 of the transmission output signal B2 is, for instance, 1440 MHz and that thus, the center frequency f2 of the transmission output signal B2 is higher than the center frequency f1 of the transmission output signal B1. As a result, as illustrated in FIG. 2, the center frequency f2 of the transmission output signal B2 is in a cut-off region in the frequency characteristics of the output matching circuit 44 of the low-pass type. Therefore, this output matching circuit 44 of the low-pass type performs a matching correspondingly to the transmission output signal B1 and cuts off the transmission output signal B2.

Reference numeral 47 denotes a coupling capacitor for eliminating a bias current. Further, reference numeral 48 denotes a first output terminal of the high-frequency amplifier 31. This output terminal 48 is connected to the antenna-side terminal of the portable telephone. Moreover, the transmission output signal B1, correspondingly to which a matching is performed by the output matching circuit 44 of the low-pass type, is outputted from this output terminal 48.

Reference numeral 49 designates an output matching circuit 49 of the high-pass filter type (hereunder referred to as an "output matching circuit of the high-pass type"). This output matching circuit 49 of the high-pass type is composed of a capacitor 50 provided on a signal line extending from the drain terminal of the FET 38 to an output terminal 52 (to be described later) and a coil 51, provided between the signal line and the ground. Namely, this output matching circuit 49 of the high-pass type has a circuit configuration similar to that of what is called a high-pass filter (HPF), in which the capacitor 50 and the coil 51 are connected to each other in an L-shaped configuration.

Further, in this output matching circuit 49 of the high-pass type, parameters such as the capacitance of the capacitor 50 and the inductance of the coil 51 are set in such a manner that a matching is performed correspondingly to the transmission output signal B2.

Furthermore, this output matching circuit 49 of the high-pass type has the frequency characteristic indicated by a characteristic line or curve a2 in FIG. 2. Namely, in the case that the parameters corresponding to the capacitor 50 and the coil 51 are set in such a manner that a matching is effected correspondingly to the center frequency f2 (namely, 1440 MHz) of the transmission output signal B2, the output matching circuit 49 of the high-pass type has the characteristics, by which signals, whose frequencies are lower than the center f2 of the transmission output signal B2, of the frequency band are cut off. As a result, as illustrated in FIG. 2, the center frequency f1 of the transmission output signal B1 is in a cut-off region in the frequency characteristics of the output matching circuit 49 of the high-pass type. Therefore, this output matching circuit 49 of the high-pass type performs a matching correspondingly to the transmission output signal B2 and cuts off the transmission output signal B1.

Reference numeral 52 denotes a second output terminal of the high-frequency amplifier 31. This output terminal 52 is connected to the antenna-side terminal of the portable telephone, together with the output terminal 48. Namely, the output terminals 48 and 52 are connected to the antenna-side terminal of the portable telephone in such a manner as to be in parallel with each other. Moreover, the transmission output signal B2, correspondingly to which a matching is performed by the output matching circuit 49 of the high-pass type, is outputted from this output terminal 52.

The high-frequency amplifier 31 of this embodiment has the aforementioned configuration. In accordance with this high-frequency amplifier 31, when the transmission input signal A1 is outputted from the aforesaid transmission signal generating circuit, the input matching circuit 34 effects a matching correspondingly to the transmission input signal A1. Further, the power amplification circuit 37 amplifies this transmission input signal A1 and outputs the transmission output signal B1. Moreover, the output matching circuit 44 of the low-pass type effects a matching correspondingly to this transmission output signal B1 and outputs this transmission output signal B1 to the antenna-side terminal of the portable telephone through the output terminal 48. Incidentally, the transmission output signal B1 outputted from the power amplification circuit 37 is cut off by the output matching circuit 49 of the high-pass type. Thus, the transmission output signal B1 does not flow through the output terminal 52.

Meanwhile, when the transmission input signal A2 is outputted from the aforesaid transmission signal generating circuit, the input matching circuit 34 of the low-pass type performs a matching correspondingly to this transmission input signal A2. Further, the power amplification circuit 37 amplifies the transmission input signal A2 and outputs this transmission output signal B2. Moreover, the output matching circuit 49 of the high-pass type effects a matching correspondingly to this transmission output signal B2 and outputs the aforesaid transmission signal B2 to the antenna-side terminal of the portable telephone through the output terminal 52. Incidentally, the transmission output signal B2 outputted from the power amplification circuit 37 is cut off by the output matching circuit 44 of the low-pass type. Thus, the transmission output signal B2 does not pass through the output terminal 48.

Hereinafter, it will be described how the aforesaid high-frequency amplifier 31 performs a matching correspondingly to each of the transmission output signals B1 and B2.

Namely, the transmission output signals B1 and B2 are different in frequency from each other. To perform a matching correspondingly to each of the transmission output signals B1 and B2, it is important to set a reflection coefficient corresponding to the transmission output signal B1 and a reflection coefficient corresponding to the transmission output signal B2 at optimum values, respectively, at the output-side terminal of the power amplification circuit 37 by taking the output characteristics, bias conditions and gain thereof into consideration.

Thus, in the output matching circuit 44 of the low-pass type, the parameter corresponding to each of the coil 45 and the capacitor 46 composing the output matching circuit 44 of the low-pass type are set in such a manner that an optimum reflection coefficient corresponding to the transmission output signal B1 is obtained. Further, in the output matching circuit 49 of the high-pass type, the parameters respectively corresponding to the capacitor 50 and the coil 51 composing the output matching circuit 49 of the high-pass type are set in such a way that an optimum reflection coefficient corresponding to the transmission output signal B2 is obtained.

Thereby, the matching is achieved correspondingly to each of the transmission output signals B1 and B2 so that a maximum gain is obtained.

Further, in the case of the high-frequency amplifier 31 of this embodiment, the output matching circuit 44 of the low-pass type, which cuts off a high-frequency band according to the frequency characteristics thereof, and the output matching circuit 49, which cuts off a low-frequency band according to the frequency characteristics thereof, are connected in parallel with each other, as illustrated in FIG. 1. Thereby, the output matching circuit 44 of the low-pass type performs a matching correspondingly to the transmission output signal B1 but cuts off the transmission output signal B2. On the other hand, the output matching circuit 49 of the high-pass type performs a matching correspondingly to the transmission output signal B2 but cuts off the transmission output signal B1.

As a result, when viewing a load from the drain terminal of the FET 38 of the power amplification circuit 37 (namely, when facing the output terminals 48 and 52), the circuit characteristics of the output matching circuit 49 of the high-pass type can have only a small effect on the reflection coefficient corresponding to the transmission output signal B1. Instead, the influence of the circuit characteristics of the output matching circuit 44 of the low-pass type upon the reflection coefficient is predominant. On the other hand, the circuit characteristics of the output matching circuit 44 of the low-pass type can have only a small effect on the reflection coefficient corresponding to the transmission output signal B1. Instead, the influence of the circuit characteristics of the output matching circuit 49 of the high-pass type upon the reflection coefficient is predominant.

Therefore, even if the parameters corresponding to the coil 45 and the capacitor 46 provided in the output matching circuit 44 of the low-pass type are changed so as to perform a matching correspondingly to the transmission output signal B1, and if the reflection coefficient corresponding to the transmission output signal B1 is regulated, the reflection coefficient corresponding to the transmission output signal B2, which is set by the output matching circuit 49 of the high-pass type, hardly changes. Moreover, similarly as in this case, even if the parameters corresponding to the capacitor 50 and the coil 51 provided in the output matching circuit 49 of the high-pass type are changed so as to perform a matching correspondingly to the transmission output signal B2, and if the reflection coefficient corresponding to the transmission output signal B2 is regulated, the reflection coefficient corresponding to the transmission output signal B1, which is set by the output matching circuit 44 of the low-pass type, scarcely changes.

Thus, in the case of this embodiment, as a result of connecting the output matching circuit 44 of the low-pass type and the output matching circuit 49 of the high-pass type in parallel with each other at the output side of the high-frequency amplifier 31, each of the two kinds of the transmission signals, whose frequencies are different from each other, can be amplified by the circuit having the corresponding optimum characteristics.

Figure 10:
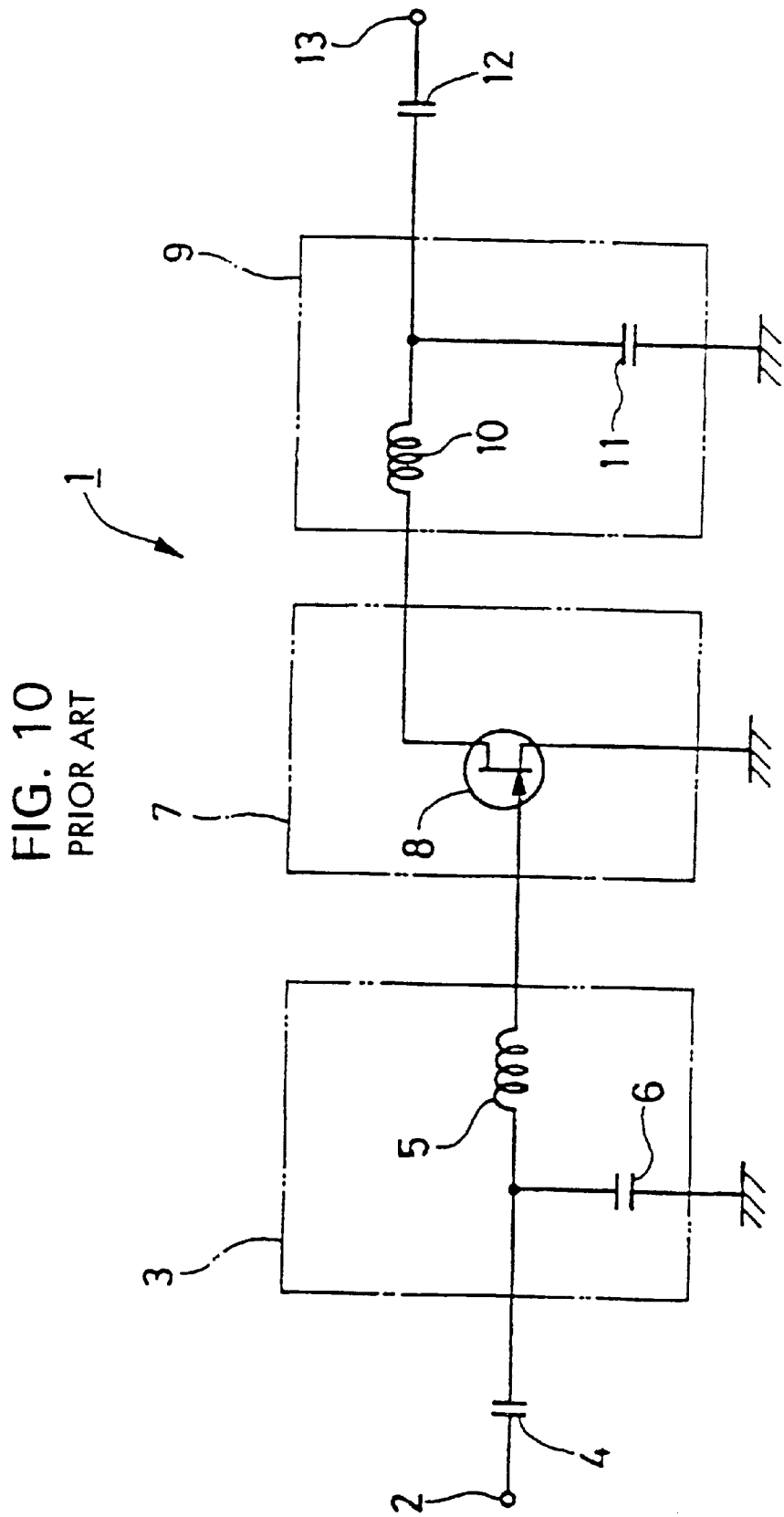
FIG. 10 is a circuit diagram illustrating the configuration of a conventional high-frequency amplifier.

Thereby, the two kinds of the transmission signals, whose frequencies are different from each other, can be amplified by only providing the single high-frequency amplifier of the present invention in the portable telephone of the common type. Further, the necessity of the two high-frequency amplifiers 21 and 22 and the changeover switches 23, which are provided in the conventional high-frequency amplifier (see FIG. 10), is eliminated. Consequently, the reduction in the size, weight and price of the portable telephone (set), in which this high-frequency amplifier 31 is provided, can be achieved.

Furthermore, a combination of matching circuits of the low-pass type and the high-pass type are employed as the output matching circuits 44 and 49. Thereby, the output matching circuit 44 of the low-pass type and the output matching circuit 49 of the high-pass type are independent of each other. Thus, the setting of the reflection coefficient corresponding to the transmission output signal B1 can be achieved independent of the setting of the reflection coefficient corresponding to the transmission output signal B2. Consequently, the design and regulation of each of the output matching circuits 44 and 49 can be facilitated.

Figure 3:
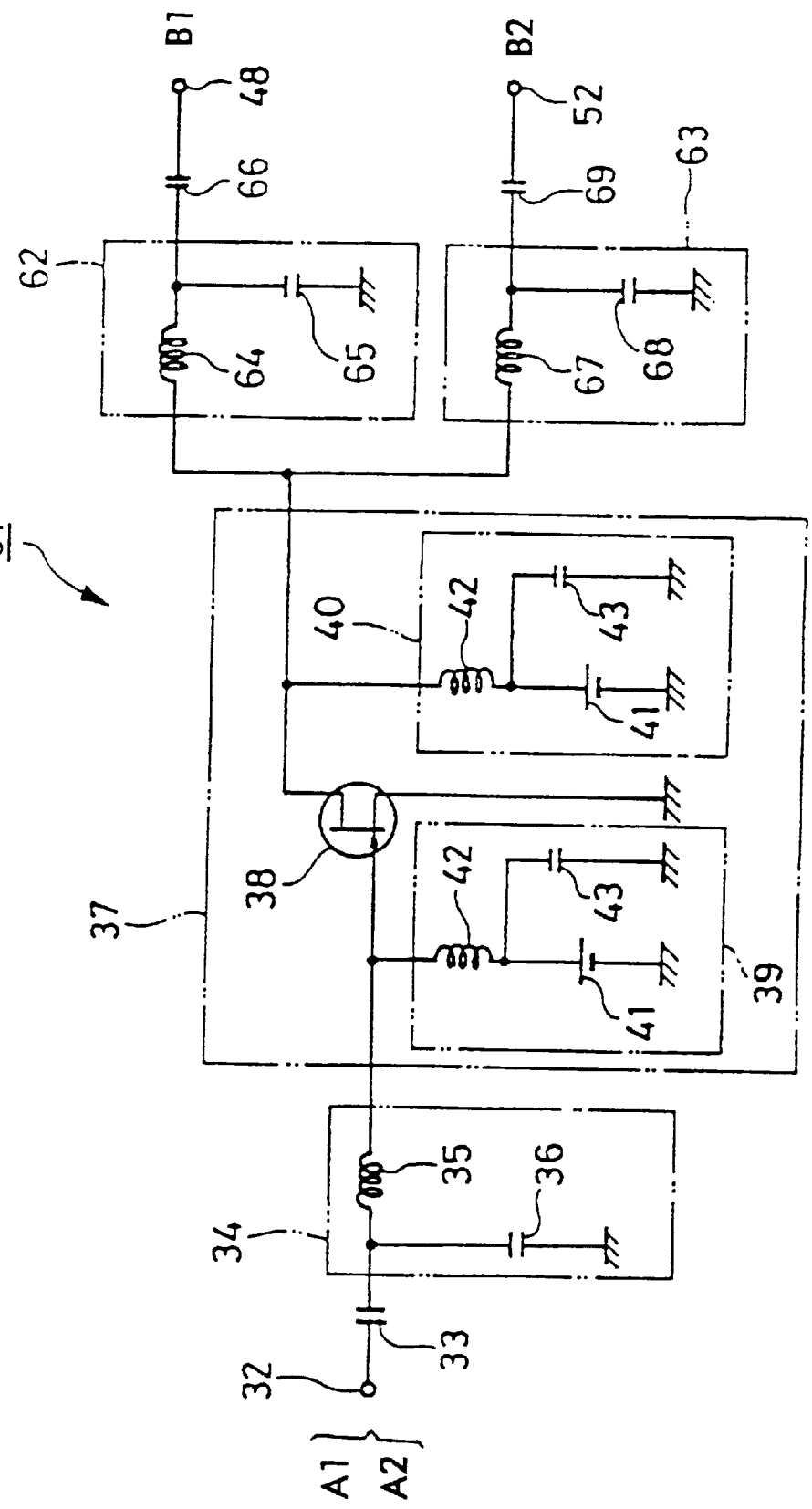
FIG. 3 is a circuit diagram illustrating the configuration of a second embodiment of the present invention.

Next, the case of application of another high-frequency amplifier embodying the present invention, namely, a second embodiment of the present invention to a high-frequency amplifier for amplifying a transmission signal of a portable telephone of the common type will be cited as another example, and will be described by referring to FIG. 3.

Characteristic aspects of this high-frequency amplifier 61 of the present invention, namely, this embodiment reside in that an output matching circuit 62 of the low-pass type, which is constituted by a matching circuit of the low-pass filter type, is employed as a first output matching circuit for performing a matching corresponding to the transmission output signal B1, whose center frequency is f1 (namely, 902.5 MHz), and that an output matching circuit 63 of the low-pass type, which is constituted by a matching circuit of the low-pass filter type, is employed as a second output matching circuit for performing a matching corresponding to the transmission output signal B2, whose center frequency is f2 (namely, 1440 MHz).

Namely, the output matching circuit 62 of the low-pass type is constituted by connecting a coil 64 and a capacitor 65 with each other in an L-shaped configuration, similarly as the output matching circuit 44 of the low-pass type in the case of the aforementioned first embodiment. Thus, the output matching circuit 62 has a circuit configuration which is similar to that of a low-pass filter. Further, in this output matching circuit 62 of the low-pass type, the parameters such as the inductance of the coil 64 and the capacity of the capacitor 65 are set in such a manner that a matching is performed correspondingly to the center frequency f1 of the transmission output signal B1. Moreover, a coupling capacitor 66 for eliminating a bypass current is provided at the output side of this output matching circuit 62 of the low-pass type.

Moreover, the output matching circuit 63 of the low-pass type is constituted by connecting a coil 67 and a capacitor 68 with each other in an L-shaped configuration, similarly as the aforementioned output matching circuit 62 of the low-pass type. Thus, the output matching circuit 63 has a circuit configuration which is similar to that of a low-pass filter. Further, in this output matching circuit 63 of the low-pass type, the parameters such as the inductance of the coil 67 and the capacitance of the capacitor 68 are set in such a manner that a matching is performed correspondingly to the center frequency f2 of the transmission output signal B2. Moreover, a coupling capacitor 69 for eliminating a bypass current is provided at the output side of this output matching circuit 63 of the low-pass type.

The high-frequency amplifier 61 constructed as above described, namely, this embodiment has advantages or effects that are nearly the same as those of the high-frequency amplifier 31, namely, the first embodiment. Incidentally, because both of the output matching circuits 62 and 63 are of the low-pass filter type, the circuit characteristics of the output matching circuit 62 and the output matching circuit 63 depend upon each other. Thus, each of the parameters of the coil 64 and the capacitor 65 and each of the parameters of the coil 67 and the capacitor 68 are set by being regulated in such a manner that the matching corresponding to the transmission output signal B1 and the matching corresponding to the transmission output signal B2 are simultaneously performed.

Next, the case of application of still another high-frequency amplifier embodying the present invention, namely, a third embodiment of the present invention to a high-frequency amplifier for amplifying a transmission signal of a portable telephone of the common type will be cited as still another example, and will be described by referring to FIG. 4. A characteristic aspect of this embodiment resides in that an input matching circuit provided at the input side of the high-frequency amplifier is constructed by connecting a matching circuit of the low-pass filter type and a matching circuit of the high-pass filter type with each other in parallel. Incidentally, like reference characters designate like composing elements of the aforementioned first embodiment. Moreover, the description of such composing elements is omitted herein.

Figure 4:
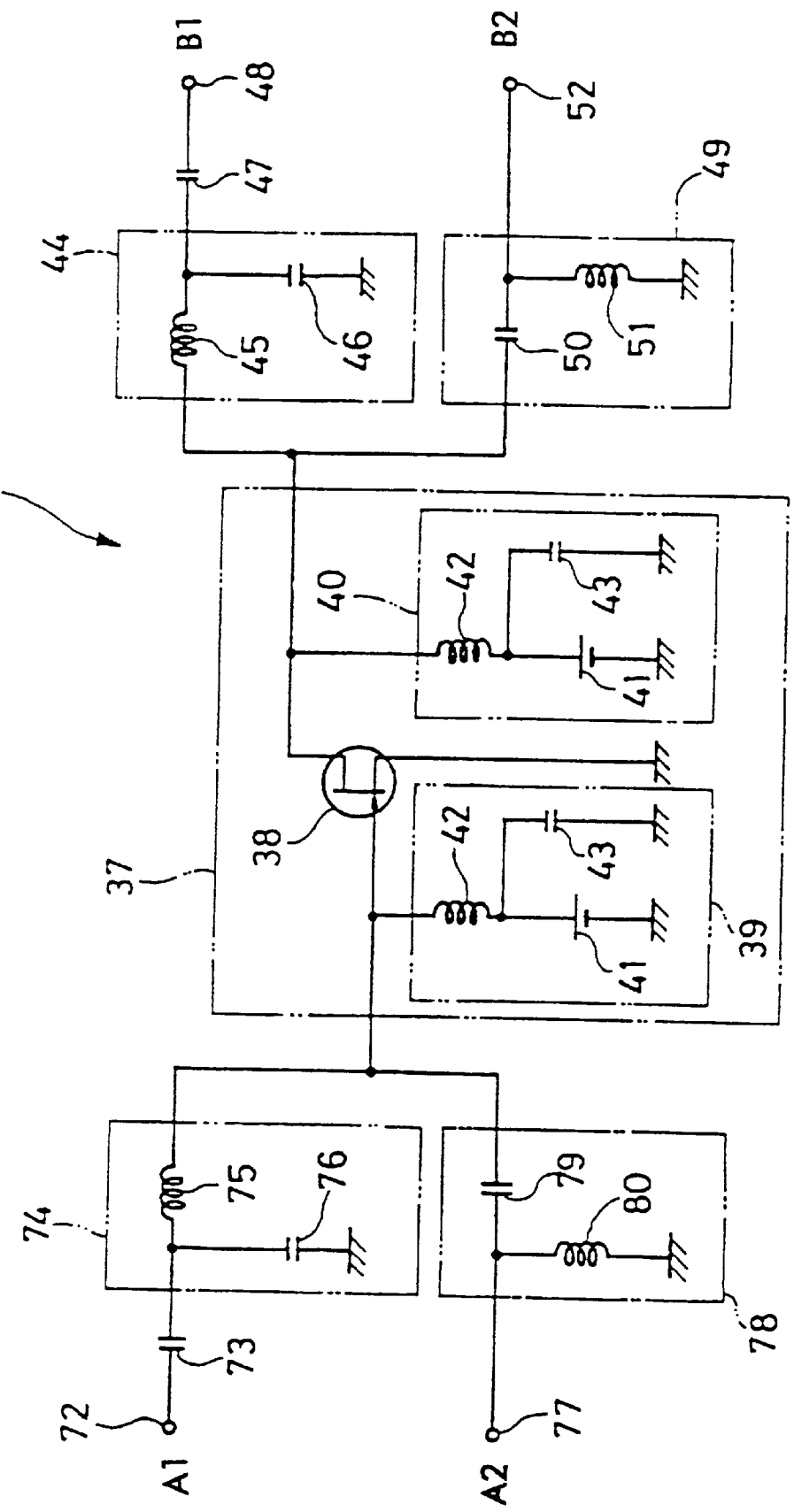
FIG. 4 is a circuit diagram illustrating the configuration of a third embodiment of the present invention.

In FIG. 4, reference numeral 71 designates a high-frequency amplifier of this embodiment. Reference numeral 72 denotes a first input terminal of this high-frequency amplifier 71. This input terminal 72 is connected to a transmission signal generating circuit (not shown) of the portable telephone of the common type. Further, a transmission input signal A1, whose center frequency is f1 (namely, 902.5 MHz) and another transmission input signal A2, whose center frequency is f2 (namely, 1440 MHz), are inputted to this input terminal 72.

Reference numeral 74 denotes an input matching circuit of the low-pass filter type (hereunder referred to as the "input matching circuit 74 of the low-pass type") connected to the input terminal 72 through a coupling capacitor 73. This input matching circuit 74 of the low-pass type is composed of a coil 75, on a signal line extending from the input terminal 72 to the gate terminal of a field effect transistor (FET) 38 (to be described later), and a capacitor 76 provided between the signal line and the ground. Namely, the input matching circuit 74 of the low-pass type has a circuit configuration similar to that of what is called a low-pass filter (LPF), in which the coil 75 and the capacitor 76 are connected in an L-shaped configuration.

Further, in the input matching circuit 74 of the low-pass type, parameters such as the inductance of the coil 75 and the capacitance of the capacitor 76 are set in such a way that a matching is performed correspondingly to the center frequency f1 of the transmission input signal A1. Namely, each of the parameters respectively corresponding to the coil 75 and the capacitor 76 is set so that a reflection coefficient corresponding to the center frequency f1 of the transmission input signal A1 is optimized and that the input return loss is minimized.

Further, in this output matching circuit 74 of the low-pass type, nearly like the case of the output matching circuit 44 of the low-pass type described in the description of the first embodiment, the parameters corresponding to the coil 75 and the capacitor 76 are set in such a manner that a matching is performed correspondingly to the center frequency f1 (902.5 MHz) of the transmission input signal A1. Thereby, the input matching circuit 74 of the low-pass type has the characteristics, by which signals, whose frequencies are higher than the center frequency f1 of the transmission input signal A1, of the frequency band are cut off (see the characteristic line α1 in FIG. 2).

Here, note that as above described, the center frequency f1 of the transmission input signal A1 is, for example, 902.5 MHz, that the center frequency f2 of the transmission input signal A2 is, for instance, 1440 MHz and that thus, the center frequency f2 of the transmission input signal A2 is higher than the center frequency f1 of the transmission input signal A1. As a result, the center frequency f2 of the transmission output signal A2 is in a cut-off region in the frequency characteristics of the input matching circuit 74 of the low-pass type. Therefore, this input matching circuit 74 of the low-pass type performs a matching correspondingly to the transmission input signal A1 and cuts off the transmission input signal A2.

Reference numeral 77 denotes a second input terminal of this high-frequency amplifier 71. This input terminal 77 is connected to a transmission signal generating circuit (not shown) of the portable telephone of the common type, together with the input terminal 72. Namely, the aforesaid input terminal 72 and the input terminal 77 are connected in parallel to the transmission signal generating circuit of the portable telephone of the common type. Further, the transmission input signals A1 and A2 are inputted to this input terminal 77.

Reference numeral 78 denotes an input matching circuit of the high-pass filter type (hereunder referred to as the "input matching circuit 78 of the high-pass type"), which is connected to the input terminal 77 and performs a matching corresponding to the transmission input signal A2. This input matching circuit 78 of the high-pass type is composed of a capacitor 79 acting as a capacitive element provided at a halfway point on a signal line extending from the input terminal 77 to the FET 38, and a coil 80, which acts as an inductive element provided between the signal line and the ground. Namely, the input matching circuit 78 of the high-pass type has a circuit configuration similar to that of what is called a high-pass filter (HPF), in which the capacitor 79 and the coil 80 are connected in an L-shaped configuration.

Further, in this output matching circuit 78 of the low-pass type, parameters such as the capacity of the capacitor 79 and the inductance of the coil 75 are set in such a manner that a matching is performed correspondingly to the center frequency f2 of the transmission input signal A2.

Further, in this output matching circuit 78 of the high-pass type, nearly like the case of the output matching circuit 49 of the high-pass type described in the description of the first embodiment, parameters corresponding to the capacitor 79 and the coil 80 are set in such a manner that a matching is performed correspondingly to the center frequency f2 (1440 MHz) of the transmission input signal A2. Thereby, the input matching circuit 78 of the high-pass type has the characteristics, by which signals, whose frequencies are lower than the center frequency f2 of the transmission input signal A2, of the frequency band are cut off (see the characteristic line or curve a2 in FIG. 2). As a result, the center frequency f1 of the transmission input signal A1 is in a cut-off region in the frequency characteristics of the input matching circuit 78 of the high-pass type. Therefore, this input matching circuit 78 of the high-pass type performs a matching correspondingly to the transmission input signal A2 and cuts off the transmission input signal A1.

The high-frequency amplifier 71 of this embodiment has the aforementioned configuration. In accordance with this high-frequency amplifier 71, when the transmission input signal A1 is outputted from the aforesaid transmission signal generating circuit to the input terminal 72, the input matching circuit 74 of the low-pass type effects a matching correspondingly to the transmission input signal A1. At that time, the transmission input signal A1 is also outputted to the input terminal 77. This transmission input signal A1 is cut off by the input matching circuit 78 of the high-pass type. Therefore, this transmission input signal A1 does not flow into the power amplification circuit 37 through the input matching circuit 78 of the high-pass type. Further, the power amplification circuit 37 amplifies this transmission input signal A1, correspondingly to which a matching is performed by the input matching circuit 74 of the low-pass type, and outputs the transmission output signal B1. Moreover, the output matching circuit 44 of the low-pass type effects a matching correspondingly to this transmission output signal B1 and outputs this transmission output signal B1 to the antenna-side terminal of the portable telephone through the output terminal 48. Incidentally, the transmission output signal B1 outputted from the power amplification circuit 37 is cut off by the output matching circuit 49 of the high-pass type. Thus, the transmission output signal B1 does not flow through the output terminal 52.

Meanwhile, when the transmission input signal A2 is outputted from the aforesaid transmission signal generating circuit to the input terminal 77, the input matching circuit 78 of the high-pass type performs a matching correspondingly to this transmission input signal A2. At that time, the transmission input signal A2 is also outputted to the input terminal 72. This transmission input signal A2 is cut off by the input matching circuit 74 of the low-pass type. Therefore, this transmission input signal A2 does not flow into the power amplification circuit 37 through the input matching circuit 74 of the low-pass type. Further, the power amplification circuit 37 amplifies the transmission input signal A2 and outputs this transmission output signal B2. Moreover, the output matching circuit 49 of the high-pass type effects a matching correspondingly to this transmission output signal B2 ad outputs the aforesaid transmission signal B2 to the antenna-side terminal of the portable telephone through the output terminal 52. Incidentally, the transmission output signal B2 outputted from the power amplification circuit 37 is cut off by the output matching circuit 44 of the low-pass type. Thus, the transmission output signal B2 does not pass through the output terminal 48.

Hereinafter, it will be described how the input matching circuit 74 of the low-pass type and the input matching circuit 78 of the high-pass type, which are the characteristic composing elements of this embodiment, perform a matching correspondingly to each of the transmission input signals A1 and A2.

Namely, the transmission input signals A1 and A2 are different in frequency from each other. To perform a matching correspondingly to each of the transmission input signals A1 and A2, there is the necessity of setting a reflection coefficient corresponding to the transmission input signal A1 and a reflection coefficient corresponding to the transmission input signal A2 at optimum values, respectively, at the input-side terminal of the power amplification circuit 37 in such a way that the input return loss is minimized.

Thus, in the input matching circuit 74 of the low-pass type, the parameter corresponding to each of the coil 75 and the capacitor 76 composing the input matching circuit 74 of the low-pass type are set in such a manner that an optimum reflection coefficient corresponding to the transmission input signal A1 is obtained. Further, in the input matching circuit 78 of the high-pass type, the parameters respectively corresponding to the capacitor 79 and the coil 80 composing the input matching circuit 78 of the high-pass type are set in such a way that an optimum reflection coefficient corresponding to the transmission input signal A2 is obtained.

Thereby, the matching is achieved correspondingly to each of the transmission input signals A1 and A2 so that the input return loss is minimized.

Further, in the case of this embodiment, the input matching circuit 74 of the low-pass type, which cuts off a high-frequency band according to the frequency characteristics thereof, and the input matching circuit 78, which cuts off a low-frequency band according to the frequency characteristics thereof, are connected in parallel with each other. Thereby, the input matching circuit 74 of the low-pass type performs a matching correspondingly to the transmission input signal A1 but cuts off the transmission input signal A2. On the other hand, the input matching circuit 78 of the high-pass type performs a matching correspondingly to the transmission input signal A2 but cuts off the transmission input signal A1.

As a result, at the input side of the power amplification circuit 37, the circuit characteristics of the input matching circuit 78 of the high-pass type have a small effect on the reflection coefficient corresponding to the transmission input signal A1. Instead, the influence of the circuit characteristics of the input matching circuit 74 of the high-pass type upon the reflection coefficient is predominant. On the other hand, the circuit characteristics of the output matching circuit 74 of the high-pass type have a small effect on the reflection coefficient corresponding to the transmission input signal A2. Instead, the influence of the circuit characteristics of the input matching circuit 78 of the low-pass type upon the reflection coefficient is predominant.

Therefore, even if the parameters corresponding to the coil 75 and the capacitor 76 provided in the input matching circuit 74 of the low-pass type are changed so as to perform a matching correspondingly to the transmission input signal A1, and if the reflection coefficient corresponding to the transmission input signal A1 is regulated, the reflection coefficient corresponding to the transmission input signal A2, which is set by the input matching circuit 78 of the high-pass type, hardly changes. Moreover, similarly as in this case, even if the parameters corresponding to the capacitor 79 and the coil 80 provided in the input matching circuit 78 of the high-pass type are changed so as to perform a matching correspondingly to the transmission input signal A2, and if the reflection coefficient corresponding to the transmission input signal A2 is regulated, the reflection coefficient corresponding to the transmission input signal A1, which is set by the input matching circuit 74 of the low-pass type, scarcely changes.

Thus, in the case of this embodiment, the input matching circuit 74 of the low-pass type and the input matching circuit 78 of the high-pass type are connected in parallel with each other at the input side of the high-frequency amplifier 71. Moreover, the output matching circuit 44 of the low-pass type and the output matching circuit 49 of the high-pass type are connected in parallel with each other at the output side of the high-frequency amplifier 71. Thereby, each of the two kinds of the transmission signals, whose frequencies are different from each other, can be amplified by the circuit having the corresponding optimum characteristics. Namely, at the input side of the high-frequency amplifier 71, the input return loss corresponding to each of the transmission input signals A1 and A2 can be minimized. Moreover, at the output side of the high-frequency amplifier 71, the gain of amplification corresponding to each of the transmission input signals B1 and B2 can be minimized.

Consequently, even in the case of the high-frequency amplifier 71 of this embodiment, the reduction in the size, weight and price of the portable telephone (set), in which this high-frequency amplifier 71 is provided, can be achieved, similarly as in the case of the high-frequency amplifier 31 of the first embodiment.

Furthermore, a combination of matching circuits of the low-pass type and the high-pass type are employed as the input matching circuits 74 and 79. Thus, the input matching circuit 74 of the low-pass type and the input matching circuit 78 of the high-pass type become independent of each other. Thus, the setting of the reflection coefficient corresponding to the transmission input signal A1 can be achieved independent of the setting of the reflection coefficient corresponding to the transmission input signal A2. Consequently, the design and regulation of each of the input matching circuits 74 and 78 can be facilitated.

Furthermore, a matching is effected correspondingly to the transmission input signal A1 by the input matching circuit 74 of the low-pass type, while the transmission input signal A2 is cut off. Further, a matching is performed correspondingly to the transmission input signal A2 by the input matching circuit 78 of the high-pass type, while the transmission input signal A1 is cut off. Thus, at the input side of the high-frequency amplifier 71, a changeover switch for selectively making a selection between the transmission input signals A1 and A2 becomes unnecessary.

Next, the case of application of yet another high-frequency amplifier embodying the present invention, namely, a fourth embodiment of the present invention to a high-frequency amplifier for amplifying a transmission signal of a portable telephone of the common type will be cited as yet another example, and will be described by referring to FIGS. 5 to 7. Characteristic aspect of this embodiment resides in that an input matching circuit provided at the input side of the high-frequency amplifier is constructed by connecting a matching circuit of the high-pass filter type and a matching circuit of the low-pass filter type in series with each other. Incidentally, like reference characters designate like composing elements of the aforementioned first embodiment. Moreover, the description of such composing elements is omitted herein.

Figure 5:
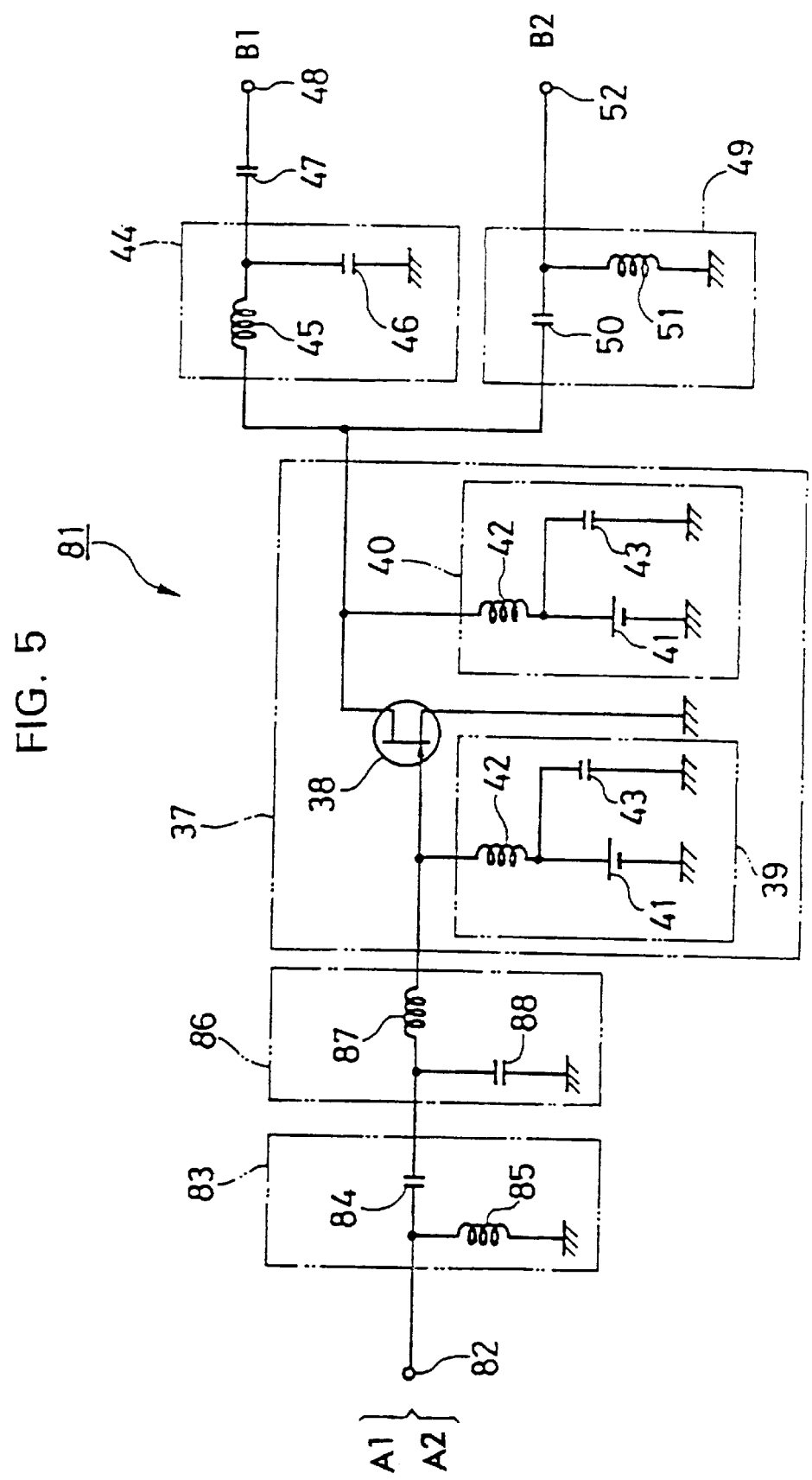
FIG. 5 is a circuit diagram illustrating the configuration of a fourth embodiment of the present invention.

In FIG. 5, reference numeral 81 designates a high-frequency amplifier of this embodiment. Reference numeral 82 denotes an input terminal of this high-frequency amplifier 81. This input terminal 82 is connected to a transmission signal generating circuit (not shown) of the portable telephone of the common type. Further, a transmission input signal A1, whose center frequency is f1 (namely, 902.5 MHz) and another transmission input signal A2, whose center frequency is f2 (namely, 1440 MHz), are inputted to this input terminal 72.

Reference numeral 83 denotes an input matching circuit of the high-pass filter type (hereunder referred to as the "input matching circuit 83 of the high-pass type") connected to the input terminal 82. This input matching circuit 83 of the high-pass type is composed of a capacitor 84, which acts as an capacitive element provided at a halfway point on a signal line extending from the input terminal 82 to the gate terminal of the FET 38 (to be described later), and a coil 85 acting as an inductive element provided between the signal line and the ground. Namely, the input matching circuit 83 of the high-pass type has a circuit configuration similar to that of what is called a high-pass filter, in which the capacitor 84 and the coil 85 are connected in an L-shaped configuration.

Further, in the input matching circuit 83 of the high-pass type, parameters such as the capacity of the capacitor 84 and the inductance of the coil 85 are set in such a way that a matching is performed correspondingly to the center frequency f1 of the transmission input signal A1.

Further, this output matching circuit 83 of the high-pass type has frequency characteristics as indicated by a characteristic line β1 in FIG. 6. Namely, the parameters corresponding to the coil 75 and the capacitor 76 are set in such a manner that a matching is performed correspondingly to the center frequency f1 (902.5 MHz) of the transmission input signal A1. Thereby, this input matching circuit 83 of the high-pass type has the characteristics, by which signals, whose frequencies are higher than the center frequency f1 of the transmission input signal A1, of the frequency band are made to pass therethrough.

Here, note that as above described, the center frequency f1 of the transmission input signal A1 is, for example, 902.5 MHz, that the center frequency f2 of the transmission input signal A2 is, for instance, 1440 MHz and that thus, the center frequency f2 of the transmission input signal A2 is higher than the center frequency f1 of the transmission input signal A1. As a result, the center frequency f2 of the transmission input signal A2 is in a passing region in the frequency characteristics of the input matching circuit 83 of the high-pass type, as illustrated in FIG. 6. Therefore, this input matching circuit 83 of the high-pass type performs a matching correspondingly to the transmission input signal A1 and permits the transmission input signal A2 to path therethrough.

Reference numeral 86 denotes an input matching circuit of the low-pass filter type (hereunder referred to as the "input matching circuit 86 of the low-pass type"), which is connected in series with the output side of the aforementioned input matching circuit 83 of the high-pass type and performs a matching corresponding to the center frequency f2 of the transmission input signal A2. This input matching circuit 86 of the high-pass type is composed of a coil 87 acting as an inductive element provided at a halfway point on a signal line extending from the input terminal 82 to the FET 38, and a capacitive 88, which acts as a capacitive element provided between the signal line and the ground. Namely, the input matching circuit 86 of the low-pass type has a circuit configuration similar to that of what is called a low-pass filter, in which the coil 87 and the capacitor 88 are connected in an L-shaped configuration.

Further, in this input matching circuit 86 of the low-pass type, parameters such as the inductance of the coil 87 and the capacity of the capacitor 88 are set in such a manner that a matching is performed correspondingly to the center frequency f2 of the transmission input signal A2.

Further, this input matching circuit 86 of the low-pass type has frequency characteristics as indicated by a characteristic line β2 in FIG. 6. Namely, parameters corresponding to the coil 87 and the capacitor 88 are set in such a manner that a matching is performed correspondingly to the center frequency f2 (1440 MHz) of the transmission input signal A2. Thereby, the input matching circuit 86 of the low-pass type has the characteristics, by which signals, whose frequencies are lower than the center frequency f2 of the transmission input signal A2, of the frequency band are permitted to pass therethrough. As a result, the center frequency f1 of the transmission input signal A1 is in a passing region in the frequency characteristics of the input matching circuit 86 of the low-pass type. Therefore, this input matching circuit 86 of the low-pass type performs a matching correspondingly to the transmission input signal A2 and permits the transmission input signal A1 to pass therethrough.

The high-frequency amplifier 81 of this embodiment has the aforementioned configuration. In accordance with this high-frequency amplifier 81, when the transmission input signal A1 is outputted from the aforesaid transmission signal generating circuit to the input terminal 82, the input matching circuit 83 of the low-pass type effects a matching correspondingly to the transmission input signal A1. Further, the power amplification circuit 37 amplifies this transmission input signal A1 and outputs the transmission output signal B1. Moreover, the output matching circuit 44 of the low-pass type effects a matching correspondingly to this transmission output signal B1 and outputs this transmission output signal B1 to the antenna-side terminal of the portable telephone through the output terminal 48.

Meanwhile, when the transmission input signal A2 is outputted from the aforesaid transmission signal generating circuit to the input terminal 82, the input matching circuit 86 of the low-pass type performs a matching correspondingly to this transmission input signal A2. Further, the power amplification circuit 37 amplifies the transmission input signal A2 and outputs this transmission output signal B2. Moreover, the output matching circuit 49 of the high-pass type effects a matching correspondingly to this transmission output signal B2 ad outputs the aforesaid transmission signal B2 to the antenna-side terminal of the portable telephone through the output terminal 52.

Hereinafter, it will be described how the input matching circuits 83 and 86 of this high-frequency amplifier 81 perform a matching correspondingly to each of the transmission input signals A1 and A2.

The transmission input signals A1 and A2 are different in frequency from each other. To perform a matching correspondingly to each of the transmission input signals A1 and A2, there is the necessity of setting a reflection coefficient corresponding to the transmission input signal A1 and a reflection coefficient corresponding to the transmission input signal A2 at optimum values, respectively, at the input-side terminal of the power amplification circuit 37 in such a manner that the input return loss is minimized.

Thus, in the input matching circuit 83 of the high-pass type, the parameter corresponding to each of the capacitor 84 and the coil 85 composing the input matching circuit 83 of the high-pass type are set in such a manner that an optimum reflection coefficient corresponding to the transmission input signal A1 is obtained. Further, in the input matching circuit 86 of the low-pass type, the parameters respectively corresponding to the coil 87 and the capacitor 88 composing the input matching circuit 86 of the low-pass type are set in such a way that an optimum reflection coefficient corresponding to the transmission input signal A2 is obtained. Thereby, the matching is achieved correspondingly to each of the transmission input signals A1 and A2 so that the input return loss is minimized.

Further, in the case of the high-frequency amplifier 81 of this embodiment, the input matching circuit 83 of the high-pass type having the frequency characteristics, by which frequencies of a high-frequency band are permitted to pass therethrough, and the input matching circuit 86 of the low-pass type having the frequency characteristics, by which frequencies of a low-frequency band are permitted to pass therethrough, are connected in series with each other, as illustrated in FIG. 5. Thereby, the input matching circuit 83 of the high-pass type performs a matching correspondingly to the transmission input signal A1 and permits the transmission input signal A2 to pass therethrough. Further, the input matching circuit 86 of the low-pass type performs a matching correspondingly to the transmission input signal A2 and permits the transmission input signal A1 to pass therethrough. Consequently, the circuit characteristic of the input matching circuit 83 of the high-pass type and the circuit characteristic of the input matching circuit 86 of the low-pass type do not depend upon each other.

Therefore, even if the parameters corresponding to the capacitor 84 and the coil 85 provided in the input matching circuit 83 of the high-pass type are changed so as to perform a matching correspondingly to the transmission input signal A1, and if the reflection coefficient corresponding to the transmission input signal A1 is regulated, the reflection coefficient corresponding to the transmission input signal A2, which is set by the input matching circuit 86 of the low-pass type, hardly changes. Moreover, similarly as in this case, even if the parameters corresponding to the coil 87 and the capacitor 88 provided in the input matching circuit 86 of the low-pass type are changed so as to perform a matching correspondingly to the transmission input signal A2, and if the reflection coefficient corresponding to the transmission input signal A2 is regulated, the reflection coefficient corresponding to the transmission input signal A1, which is set by the input matching circuit 83 of the high-pass type, scarcely changes.

Referring now to FIG. 7, there is illustrated the manner of change in the input-return-loss characteristics of the high-frequency amplifier 81 at the time when the capacitance of the capacitor 88 provided in the input matching circuit 86 of the high-frequency amplifier 81 is changed. Namely, the characteristic line γ1 of FIG. 7 indicates the input-return-loss characteristics of the high-frequency amplification circuit 81 before the capacitance of the aforementioned capacitor 88 is changed. The characteristic line γ2 indicates the input-return-loss characteristics of the high-frequency amplification circuit 81 after the capacitance of the aforementioned capacitor 88 is changed. As is seen from this figure, in response to a change in the capacitance of the capacitor 88 provided in the input matching circuit 86 of the low pass type, the input-return-loss characteristics in the vicinity of the center frequency f2 of the transmission input signal A2 change as indicated by an arrow R. However, the input-return-loss characteristics in the vicinity of the center frequency f1 of the transmission input signal A1 do not change. Namely, as is understood from FIG. 7, the circuit characteristics of the input matching circuit 83 of the high-pass type has independence from the circuit characteristics of the input matching circuit 86 of the high-pass type.

Thus, the input matching circuit 83 of the high-pass type and the input matching circuit 86 of the low-pass type are independent of each other. Hence, the setting of the reflection coefficient corresponding to the transmission input signal A1 can be achieved independent of the setting of the reflection coefficient corresponding to the transmission input signal A2. Consequently, the design and regulation of each of the input matching circuits 83 and 86 can be further facilitated.

Thus, in the case of this embodiment, as a result of connecting the input matching circuit 83 of the high-pass type and the input matching circuit 86 of the low-pass type in series with each other at the input side of the high-frequency amplifier 81, and of further connecting the output matching circuit 44 of the low-pass type and the output matching circuit 49 of the high-pass type in parallel with each other at the output side of the high-frequency amplifier 81, each of the two kinds of the transmission signals, whose frequencies are different from each other, can be amplified by the circuit having the corresponding optimum characteristics.

Figure 11:
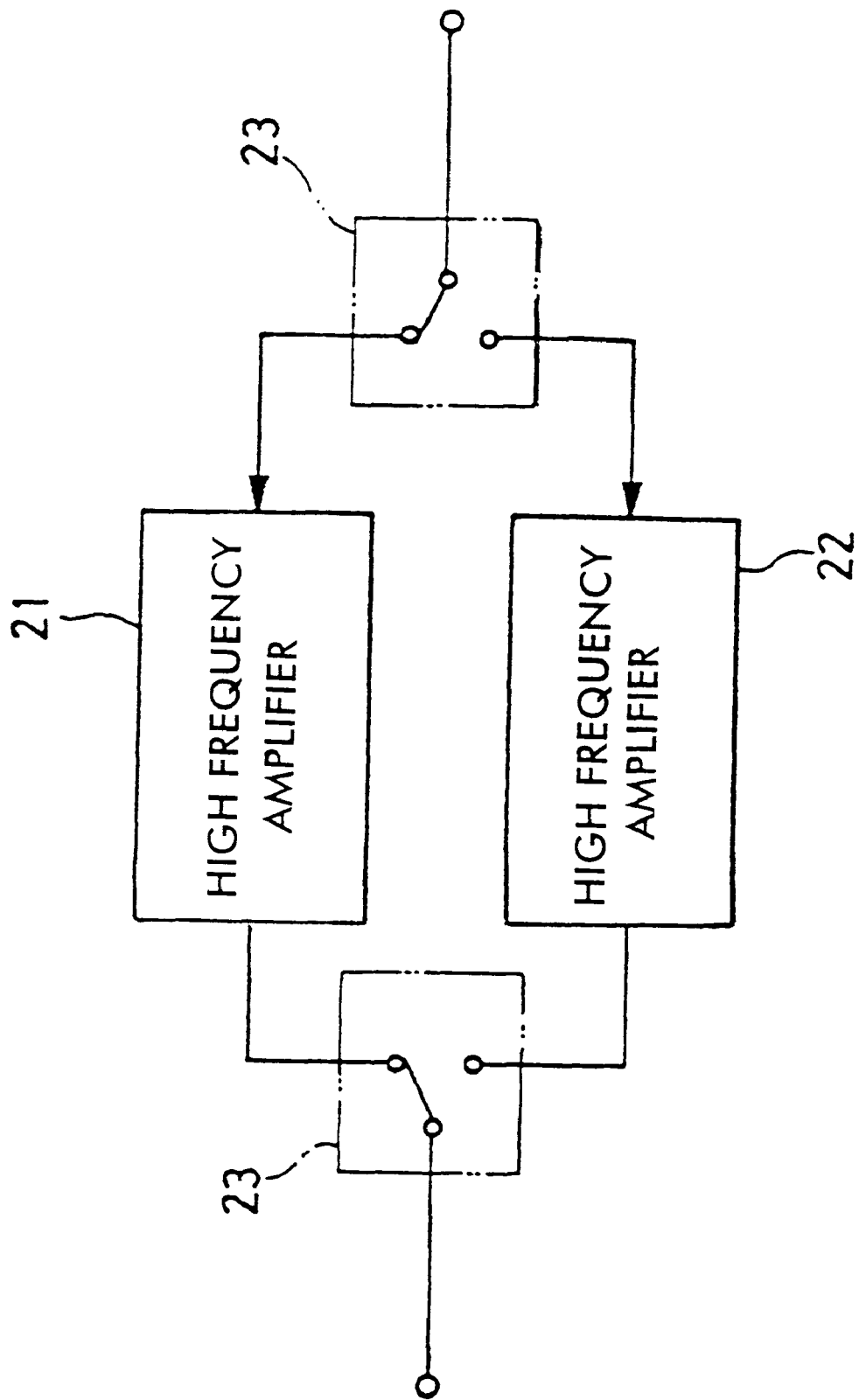
FIG. 11 is a block circuit diagram illustrating the configuration of another conventional high-frequency amplifier having changeover switches.

Thereby, the two kinds of the transmission signals, whose frequencies are different from each other, can be amplified by only providing the single high-frequency amplifier 81 of the present invention in the portable telephone of the common type. Further, the necessity of the two high-frequency amplifiers 21 and 22 and the changeover switches 23, which are provided in the conventional high-frequency amplifier (see FIG. 11), is eliminated. Consequently, the reduction in the size, weight and price of the portable telephone (set), in which this high-frequency amplifier 81 is provided, can be achieved.

Furthermore, a combination of matching circuits of the high-pass type and the low-pass type are employed as the input matching circuits 83 and 86. Thereby, the input matching circuit 83 of the high-pass type and the input matching circuit 86 of the low-pass type are independent of each other. Thus, the setting of the reflection coefficient corresponding to the transmission input signal A1 can be achieved independent of the setting of the reflection coefficient corresponding to the transmission input signal A2. Consequently, the design and regulation of each of the input matching circuits 83 and 86 can be facilitated.

Figure 12:
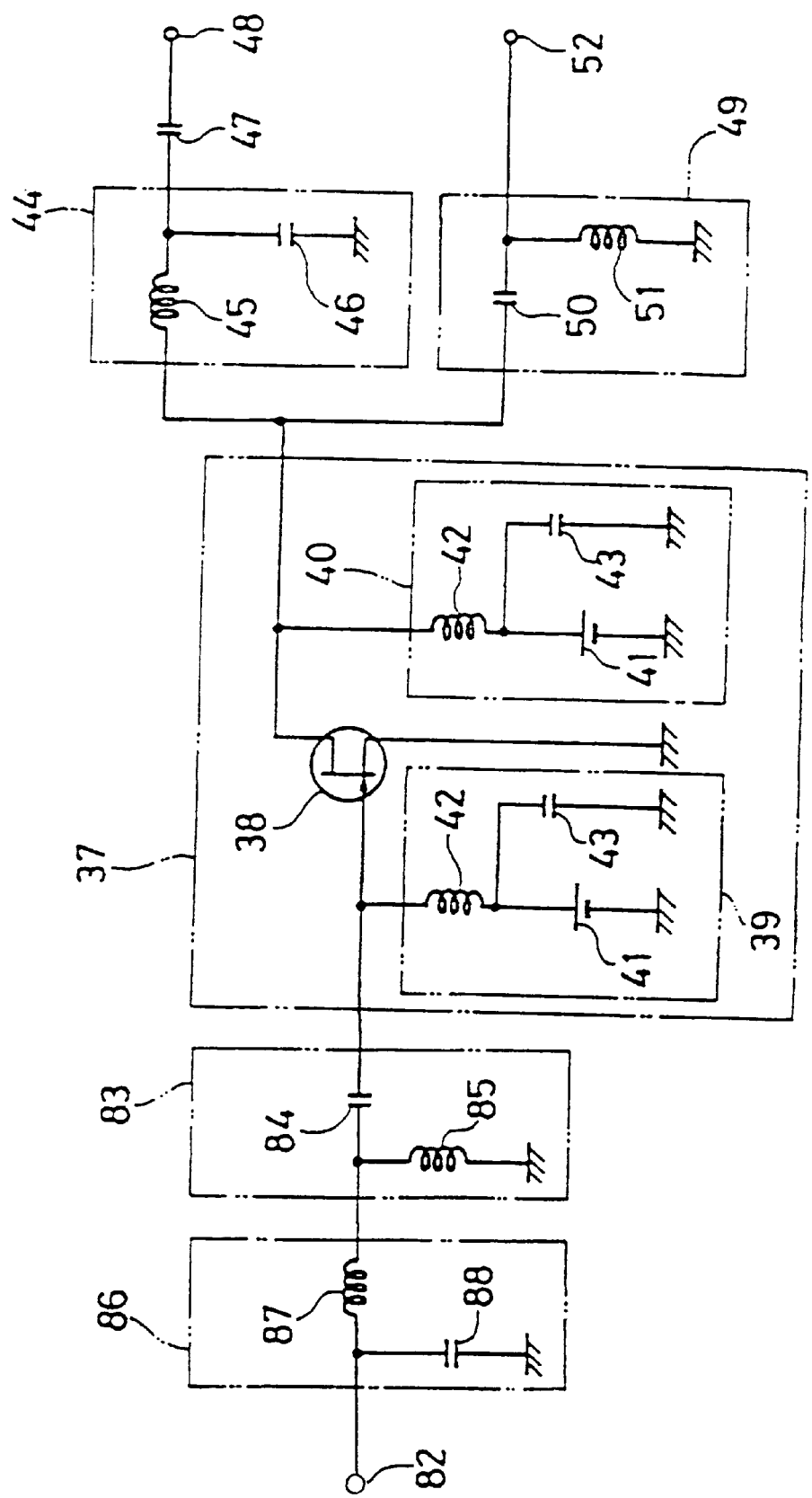
FIG. 12 is a circuit diagram illustrating a modification of the fourth embodiment of the invention.

In a modification of the fourth embodiment of the invention, shown in FIG. 12, the positions of the low-pass type input matching circuit 86 and the high-pass type input matching circuit 83 have been reversed.

Figure 8:
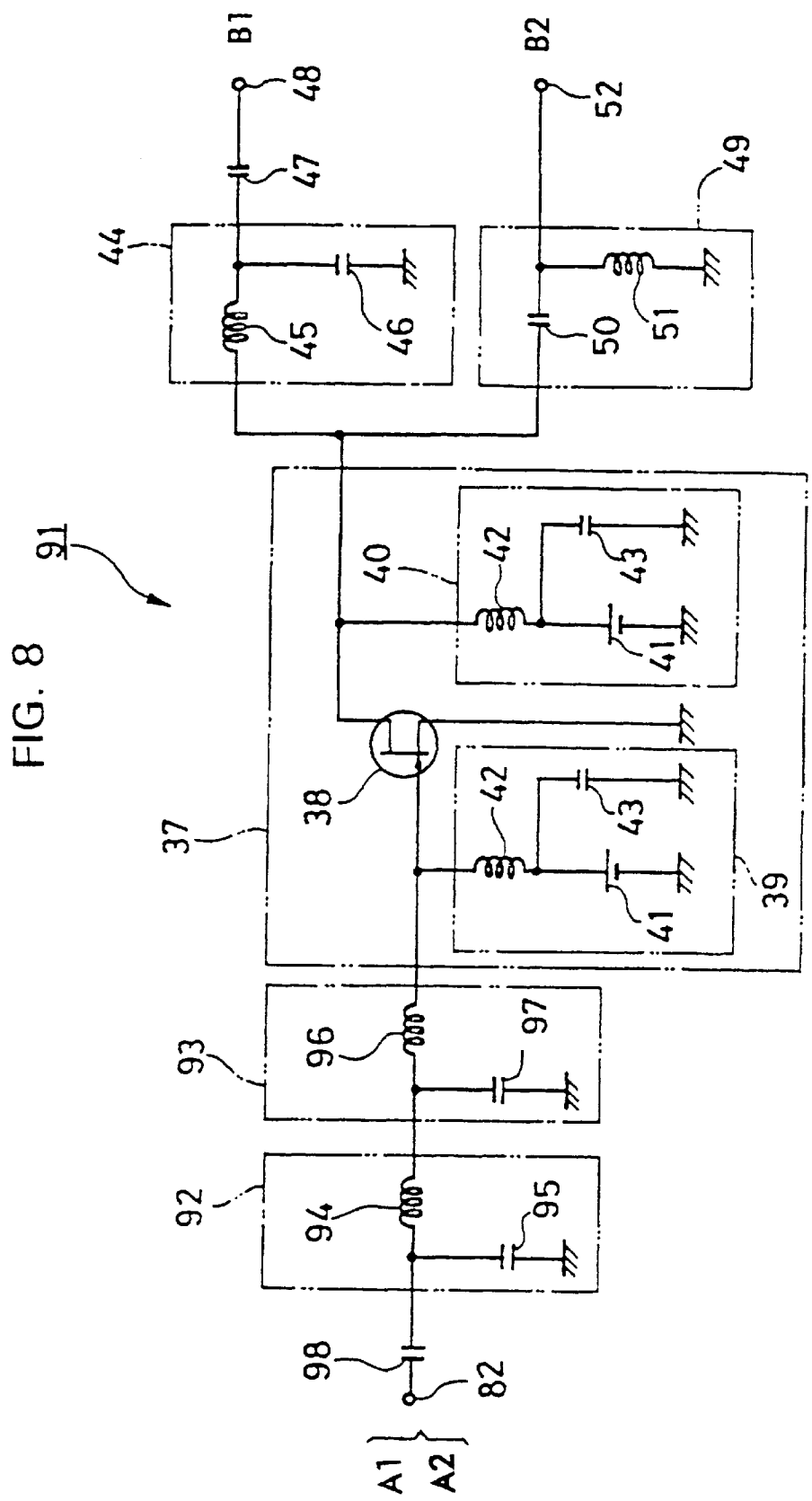
FIG. 8 is a circuit diagram illustrating the configuration of a fifth embodiment of the present invention.

Next, the case of application of a further high-frequency amplifier embodying the present invention, namely, a fifth embodiment of the present invention to a high-frequency amplifier for amplifying a transmission signal of a portable telephone of the common type will be cited as a further example, and will be described by referring to FIG. 8.

Characteristic aspects of this high-frequency amplifier 91 of the present invention, namely, this embodiment reside in that an input matching circuit 92 of the low-pass type, which is constituted by a matching circuit of the low-pass filter type, is employed as a first input matching circuit for performing a matching corresponding to the transmission input signal A1, whose center frequency is f1 (namely, 902.5 MHz), and that an input matching circuit 93 of the low-pass type, which is constituted by a matching circuit of the low-pass filter type, is employed as a second output matching circuit for performing a matching corresponding to the transmission input signal A2, whose center frequency is f2 (namely, 1440 MHz).

Namely, the input matching circuit 92 of the low-pass type is constituted by connecting a coil 94 and a capacitor 95 with each other in an L-shaped configuration, similarly as the input matching circuit 86 of the low-pass type in the case of the aforementioned first embodiment. Thus, the output matching circuit 92 has a circuit configuration which is similar to that of a low-pass filter. Further, in this input matching circuit 92 of the low-pass type, the parameters such as the inductance of the coil 94 and the capacitance of the capacitor 95 are set in such a manner that a matching is performed correspondingly to the center frequency f1 of the transmission input signal A1.

Moreover, the input matching circuit 93 of the low-pass type is constituted by connecting a coil 96 and a capacitor 97 with each other in an L-shaped configuration, similarly as the aforementioned input matching circuit 92 of the low-pass type. Thus, the input matching circuit 93 has a circuit configuration which is similar to that of a low-pass filter. Further, in this input matching circuit 93 of the low-pass type, the parameters such as the inductance of the coil 96 and the capacitance of the capacitor 97 are set in such a manner that a matching is performed correspondingly to the center frequency f2 of the transmission input signal A2.

Incidentally, a coupling capacitor 98 is provided between the input terminal 82 and the input matching circuit 92 of the low-pass type.

The high-frequency amplifier 91 constructed as above described, namely, this embodiment has advantages or effects that are nearly the same as those of the high-frequency amplifier 81, namely, the fourth embodiment. Incidentally, because both of the input matching circuits 92 and 93 of this embodiment are of the low-pass filter type, the circuit characteristic of the input matching circuit 92 and that of the input matching circuit 93 depend upon each other. Thus, each of the parameters of the coil 94 and the capacitor 95 and each of the parameters of the coil 96 and the capacitor 97 are set by being regulated in such a manner that the matching corresponding to the transmission input signal A1 and the matching corresponding to the transmission input signal A2 are simultaneously performed.

Figure 9:
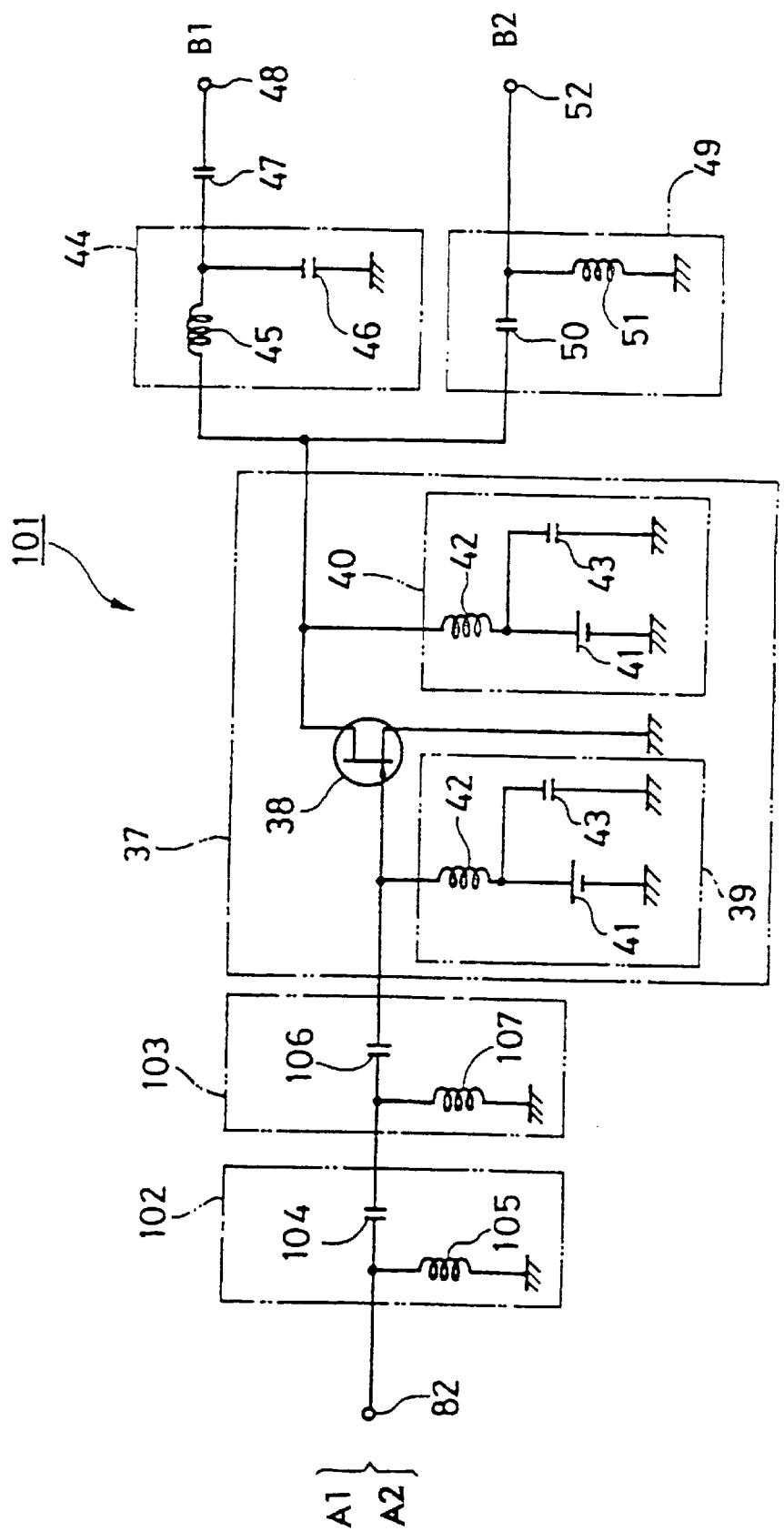
FIG. 9 is a circuit diagram illustrating the configuration of a sixth embodiment of the present invention.

Next, the case of application of yet another high-frequency amplifier embodying the present invention, namely, a sixth embodiment of the present invention to a high-frequency amplifier for amplifying a transmission signal of a portable telephone of the common type will be cited as yet another example, and will be described by referring to FIG. 9.

Characteristic aspects of this high-frequency amplifier 101 of the present invention, namely, this embodiment reside in that an input matching circuit 102 of the high-pass type, which is constituted by a matching circuit of the high-pass filter type, is employed as a first input matching circuit for performing a matching corresponding to the transmission input signal A1, whose center frequency is f1 (namely, 902.5 MHz), and that an input matching circuit 103 of the high-pass type, which is constituted by a matching circuit of the high-pass filter type, is employed as a second output matching circuit for performing a matching corresponding to the transmission input signal A2, whose center frequency is f2 (namely, 1440 MHz).

Namely, the input matching circuit 102 of the high-pass type is constituted by connecting a capacitor 104 and a coil 105 with each other in an L-shaped configuration, similarly as the input matching circuit 78 of the high-pass type in the case of the aforementioned third embodiment. Thus, the output matching circuit 102 has a circuit configuration which is similar to that of a high-pass filter. Further, in this input matching circuit 102 of the high-pass type, the parameters such as the capacitance of the capacitor 104 and the inductance of the coil 105 and are set-in such a manner that a matching is performed correspondingly to the center frequency f1 of the transmission input signal A1.

Moreover, the input matching circuit 103 of the high-pass type is constituted by connecting a capacitor 106 and a coil 107 with each other in an L-shaped configuration, similarly as the aforementioned input matching circuit 102 of the high-pass type. Thus, the input matching circuit 103 has a circuit configuration which is similar to that of a high-pass filter. Further, in this input matching circuit 103 of the high-pass type, the parameters such as the capacitance of the capacitor 106 and the inductance of the coil 107 are set in such a manner that a matching is performed correspondingly to the center frequency f2 of the transmission input signal A2.

The high-frequency amplifier 101 constructed as above described, namely, the sixth embodiment has advantages or effects that are nearly the same as those of the high-frequency amplifier 91, namely, the fifth embodiment.

Incidentally, in the case of the aforesaid first or second embodiment, the input matching circuit 34 of the high-frequency amplifier 31 (61) is constituted by a matching circuit of the low-pass filter type. However, the present invention is not limited thereto. The input matching circuit of the high-frequency amplifier 31 (61) may be constituted by a matching circuit of the high-pass filter type.

Further, in the case of the aforesaid second embodiment, the output matching circuits 62 and 63 of the high-frequency amplifier 61 is constituted by a matching circuit of the low-pass filter type. However, the present invention is not limited thereto. Each of the output matching circuits of the high-frequency amplifier 61 may be constituted by a matching circuit of the high-pass filter type.

Moreover, in the case of the high-frequency amplifier 81 of the fourth embodiment, the input matching circuit 83 of the high-pass type is connected to the input terminal 82. Further, the input matching circuit 86 of the low-pass type is connected to the output side or terminal of the input matching circuit 83 of the high-pass type. However, if the input matching circuit 83 of the high-pass type and the input matching circuit 86 of the low-pass type are replaced with each other and are then connected to this high-frequency amplifier, such a new high-frequency amplifier is substantially the same as the high-frequency amplifier of the fourth embodiment. Namely, the input matching circuit 86 of the low-pass type may be connected to the input terminal 82. Moreover, the input matching circuit 83 of the high-pass type may be connected to the output side of the input matching circuit 86 of the low-pass type.

Furthermore, in the descriptions of the aforementioned embodiments, the cases, in which the high-frequency amplifiers 31, 61, 71, 81, 91 and 101 are provided in the portable telephones of the common type, have been cited as examples and described. However, the present invention is not limited thereto. The high-frequency amplifiers of the present invention can be applied to and used as high-frequency amplifiers for amplifying the two kinds of high-frequency signals, whose frequencies are different from each other.

Besides, in the foregoing descriptions of the embodiments, the high-frequency amplifiers 31, 61, 71, 81, 91 and 101 have been described as power amplifiers. The present invention is not limited thereto. The high-frequency amplifiers may be used as small signal amplifiers.

Although the preferred embodiments of the present invention have been described above, it should be understood that the present invention is not limited thereto and that other modifications will be apparent to those skilled in the art without departing from the spirit of the invention.

What is claimed is:

1. A high-frequency amplifier comprising:
   an input matching circuit which is operable for performing matching corresponding to both a first high-frequency input signal and to a second high-frequency input signal, whose frequency is different from that of the first high-frequency input signal;
   an amplification circuit, which is connected to an output of the input matching circuit, and which is operable for outputting a first high-frequency output signal by amplifying the first high-frequency input signal, and for outputting a second high-frequency output signal by amplifying the second high-frequency input signal;
   a first output terminal;
   a first output matching circuit, which is connected to an output of said amplification circuit, which is operable for performing matching corresponding to the first high-frequency output signal and outputting said first high-frequency output signal to said first output terminal;
   a second output terminal; and
   a second output matching circuit, which is connected lo the output of said amplification circuit in parallel with said first output matching circuit, for performing matching corresponding to the second high-frequency output signal and outputting said second high-frequency output signal to said second output terminal;
   wherein said first and second output terminals are electrically separated from each other for respectively outputting said first and second output signals from said high-frequency amplifier.

2. The high-frequency amplifier according to claim 1, wherein said input matching circuit comprises a low-pass filter.

3. The high-frequency amplifier according to claim 1, wherein said first and second output matching circuits comprise respective filters.

4. The high-frequency amplifier according to claim 3, wherein said first output matching circuit comprises a low-pass filter and said second output matching circuit comprises a high-pass filter.

5. The high-frequency amplifier according to claim 4, wherein said input matching circuit comprises a low-pass filter.

6. The high-frequency amplifier according to claim 3, wherein said first and second output matching circuits comprise respective low-pass filters.

7. The high-frequency amplifier according to claim 6, wherein said input matching circuit comprises a low-pass filter.

8. The high-frequency amplifier according to claim 3, wherein said respective filters have overlapping pass ranges.

9. The high-frequency amplifier according to claim 3, wherein said respective filters have non-overlapping pass ranges.

10. A high-frequency amplifier comprising:
    a first input terminal;
    a first input matching circuit which is operable for performing matching corresponding to a first high-frequency input signal received from said first input terminal;
    a second input terminal;
    a second input matching circuit, which is operable for performing matching corresponding to a second high-frequency input signal received from said second input terminal whose frequency is different from that of the first high-frequency input signal;
    wherein said first and second input terminals are electrically separated from each other for respectively receiving said first and second input signals to said high-frequency amplifier;
    an amplification circuit, which is connected to an output of each of the input matching circuits, which is operable for outputting a first high-frequency output signal by amplifying the first high-frequency input signal, and for outputting a second high-frequency output signal by amplifying the second high-frequency input signal;
    a first output matching circuit, which is connected to an output of said amplification circuit, and which is operable for performing matching and thereby outputting the first high-frequency output signal to a first output terminal; and
    a second output matching circuit, which is connected to the output of said amplification circuit, and which is operable for performing matching and thereby outputting the second high-frequency output signal to a second output terminal;
    wherein said first and second output terminals are electrically separated from each other for respectively outputting said first and second output signals from said high-frequency amplifier.

11. A high-frequency amplifier comprising:
    a first input matching circuit which is operable for performing matching corresponding to a first high-frequency input signal;
    a second input matching circuit, which is connected in parallel with said first input matching circuit, and which is operable for performing matching corresponding to a second high-frequency input signal, whose frequency is different from that of the first high-frequency input signal;
    an amplification circuit, which is connected to an output of each of the input matching circuits, which is operable for outputting a first high-frequency output signal by amplifying the first high-frequency input signal, and for outputting a second high-frequency output signal by amplifying the second high-frequency input signal;

a first output matching circuit, which is connected to an output of said amplification circuit, and which is operable for performing matching corresponding to the first high-frequency output signal; and a second output matching circuit, which is connected to the output of said amplification circuit in parallel with said first output matching circuit, and which is operable for performing matching corresponding to the second high-frequency output signal;

wherein said first input matching circuit is a low-pass filter matching circuit which cuts off the second high-frequency input signal, whose frequency is higher than that of said first high-frequency input signal, and wherein said second input matching circuit is a high-pass filter matching circuit which cuts off the first high-frequency input signal.

12. The high-frequency amplifier according to claim 11, wherein said first output matching circuit is a low-pass filter matching circuit which cuts off the second high-frequency input signal, whose frequency is higher than that of said first high-frequency output signal, and wherein said second output matching circuit is a high-pass filter matching circuit which cuts off the first high-frequency output signal.

13. A high-frequency amplifier comprising:

a first input matching circuit which is operable for performing matching corresponding to a first high-frequency input signal;

a second input matching circuit, which is connected in parallel with said first input matching circuit, and which is operable for performing matching corresponding to a second high-frequency input signal, whose frequency is different from that of the first high-frequency input signal;

an amplification circuit, which is connected to an output of each of the input matching circuits, which is operable for outputting a first high-frequency output signal by amplifying the first high-frequency input signal, and for outputting a second high-frequency output signal by amplifying the second high-frequency input signal;

a first output matching circuit, which is connected to an output of said amplification circuit, and which is operable for performing matching corresponding to the first high-frequency output signal; and a second output matching circuit, which is connected to the output of said amplification circuit in parallel with said first output matching circuit, and which is operable for performing matching corresponding to the second high-frequency output signal;

wherein said first output matching circuit is a low-pass filter matching circuit which cuts off the second high-frequency input signal, whose frequency is higher than that of said first high-frequency output signal, and wherein said second output matching circuit is a high-pass filter matching circuit which cuts off the first high-frequency output signal.

14. A high-frequency amplifier comprising:

a first input matching circuit which is operable for performing matching corresponding to a first high-frequency input signal;

a second input matching circuit, which is connected in series to an output of said first input matching circuit, and which is operable for performing matching corresponding to a second high-frequency input signal, whose frequency is different from that of the first high-frequency input signal;

an amplification circuit, which is connected to an output of said second input matching circuit, and which is operable for outputting a first high-frequency output signal by amplifying the first high-frequency input signal, and for outputting a second high-frequency output signal by amplifying the second high-frequency input signal;

a first output matching circuit, which is connected to an output of said amplification circuit, and which is operable for performing matching corresponding to the first high-frequency output signal; and a second output matching circuit, which is connected to the output of said amplification circuit in parallel with said first output matching circuit, and which is operable for performing matching corresponding to the second high-frequency output signal.

15. The high-frequency amplifier according to claim 14, wherein said first input matching circuit is a high-pass filter matching circuit that permits the second high-frequency input signal, whose frequency is higher than that of said first high-frequency input signal, to pass therethrough, and wherein said second input matching circuit is a low-pass filter matching circuit that permits the first high-frequency input signal to pass therethrough.

16. The high-frequency amplifier according to claim 14, wherein said first input matching circuit is a low-pass filter matching circuit that permits the second high-frequency input signal, whose frequency is lower than that of said first high-frequency input signal, to pass therethrough, and wherein said second input matching circuit is a high-pass filter matching circuit that permits the first high-frequency input signal to pass therethrough.

17. The high-frequency amplifier according to claim 14, wherein said first and second input matching circuits comprise respective filters.

18. The high-frequency amplifier according to claim 17, wherein said respective filters have overlapping pass ranges.

19. The high-frequency amplifier according to claim 18, wherein said respective filters are low-pass filters.

20. The high-frequency amplifier according to claim 18, wherein said respective filters are high-pass filters.

21. The high-frequency amplifier according to any one of claims 14, 15, 16, 19 and 20, wherein said first output matching circuit is a low-pass filter matching circuit that cuts off the second high-frequency input signal, whose frequency is higher than said first high-frequency output signal, and wherein said second output matching circuit is a high-pass filter matching circuit that cuts off the first high-frequency output signal.

* * * * *